(12) United States Patent
Fu

(10) Patent No.: US 12,085,863 B2
(45) Date of Patent: Sep. 10, 2024

(54) METHOD FOR DETERMINING STOCHASTIC VARIATION ASSOCIATED WITH DESIRED PATTERN

(71) Applicant: ASML NETHERLANDS B.V., Veldhoven (NL)

(72) Inventor: Jiyou Fu, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/138,383

(22) Filed: Apr. 24, 2023

(65) Prior Publication Data

US 2023/0280659 A1    Sep. 7, 2023

Related U.S. Application Data

(63) Continuation of application No. 17/610,481, filed as application No. PCT/EP2020/061713 on Apr. 28, 2020, now Pat. No. 11,669,019.

(Continued)

(51) Int. Cl.
*G03F 7/00* (2006.01)
*G06T 7/00* (2017.01)

(52) U.S. Cl.
CPC .......... *G03F 7/70625* (2013.01); *G06T 7/001* (2013.01); *G06T 2207/10061* (2013.01); *G06T 2207/30148* (2013.01)

(58) Field of Classification Search
CPC ............ G03F 7/70616; G03F 7/70625; G06T 2207/10061; G06T 2207/20076; G06T 2207/30148; G06T 7/001
See application file for complete search history.

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 107636539 | 1/2018 |
| CN | 107885043 | 4/2018 |

(Continued)

OTHER PUBLICATIONS

International Search Report and Written Opinion issued in corresponding PCT Patent Application No. PCT/EP2020/061713, dated Aug. 14, 2020.

(Continued)

*Primary Examiner* — Deoram Persaud
(74) *Attorney, Agent, or Firm* — Pillsbury Winthrop Shaw Pittman LLP

(57) ABSTRACT

A method for determining stochastic edge placement error associated with a pattern. The method includes acquiring, via a metrology tool, a plurality of images of the pattern at a defined location on the substrate without performing a substrate alignment therebetween; and generating at least two data: (i) first data associated with the pattern using a first set of images of the plurality of images, and (ii) second data associated with the pattern using a second set of images of the plurality of images. The first set of images and the second set of images include at least one different image. The method further includes determining (e.g., via a decomposition algorithm), using the first data and the second data associated with the pattern at the defined location, the stochastic edge placement error associated with the pattern.

20 Claims, 21 Drawing Sheets

Related U.S. Application Data

(60) Provisional application No. 62/850,838, filed on May 21, 2019.

(56) References Cited

U.S. PATENT DOCUMENTS

| | | | |
|---|---|---|---|
| 5,523,193 | A | 6/1996 | Nelson |
| 5,745,660 | A | 4/1998 | Kolpatzik et al. |
| 5,969,441 | A | 10/1999 | Loopstra et al. |
| 6,046,792 | A | 4/2000 | Van Der Werf et al. |
| 7,587,704 | B2 | 9/2009 | Ye et al. |
| 8,200,468 | B2 | 6/2012 | Ye et al. |
| 9,046,475 | B2 | 6/2015 | Langer et al. |
| 9,646,220 | B2 | 5/2017 | Weisbuch |
| 11,126,090 | B2 | 9/2021 | Hansen |
| 11,422,473 | B2 | 8/2022 | Liang et al. |
| 2009/0157360 | A1 | 6/2009 | Ye et al. |
| 2010/0315614 | A1 | 12/2010 | Hansen |
| 2015/0146966 | A1 | 5/2015 | Weisbuch |
| 2018/0011407 | A1 | 1/2018 | Hsu |
| 2020/0249578 | A1 | 8/2020 | Hsu et al. |
| 2021/0149312 | A1 | 5/2021 | Tel et al. |
| 2021/0263405 | A1 | 8/2021 | Stanton et al. |
| 2021/0382394 | A1 | 12/2021 | Levinson et al. |
| 2022/0100098 | A1* | 3/2022 | Tel ................. G03F 7/70525 |
| 2022/0137514 | A1 | 5/2022 | Wang et al. |
| 2022/0179321 | A1* | 6/2022 | Ma ................. G06T 7/0004 |
| 2022/0229374 | A1* | 7/2022 | Peng ................. G03F 7/705 |
| 2022/0327364 | A1 | 10/2022 | Hunsche et al. |

FOREIGN PATENT DOCUMENTS

| | | |
|---|---|---|
| JP | 2017227892 | 12/2017 |
| TW | 201543172 | 11/2015 |
| TW | 201702756 | 1/2017 |
| TW | 201901286 | 1/2019 |
| TW | 201905588 | 2/2019 |
| WO | 2010059954 | 5/2010 |
| WO | 2018233900 | 12/2018 |
| WO | 2019063206 | 4/2019 |
| WO | 2019233711 | 12/2019 |

OTHER PUBLICATIONS

Taiwanese Office Action issued in corresponding Taiwanese Patent Application No. 109115056, dated May 27, 2021.
Spence, C.: "Full-Chip Lithography Simulation and Design Analysis—How OPC Is Changing IC Design", Proc. of SPIE, vol. 5751, pp. 1-14 (2005).
Cao, Y. et al.: "Optimized Hardware and Software For Fast, Full Chip Simulation", Proc. of SPIE, vol. 5754 (2005).
Rosenbluth, A.E. et al.: "Optimum Mask and Source Patterns to Print A Given Shape", Journal of Microlithography, Microfabrication, Microsystems, Proc. of SPIE, 1(1), pp. 13-20 (2002).
Granik, Y.: "Source Optimization for Image Fidelity and Throughput", Journal of Microlithography, Microfabrication, Microsystems 3(4), pp. 509-522 (Oct. 2004).
Socha, R. et. al.: "Simultaneous Source Mask Optimization (SMO)", Proc. of SPIE, vol. 5853 (2005).
Bhattacharyya, K.: "Tough road ahead for device overlay and edge placement error", Proc. of SPIE, vol. 10959 (Mar. 26, 2019).
Lorusso, G. F. et al: "Roughness decomposition: an on-wafer methodology to discriminate mask, metrology, and shot noise contributions", Proc. of SPIE, vol. 10959 (Mar. 26, 2019).
Lorusso, G. F. et al: "Influence of etch process on contact hole local critical dimension uniformity in extreme-ultraviolet lithography," Proc. of SPIE, vol. 9425 (2015).
Montgomery, D.C., "Design and Analysis of Experiments", John Wiley & Sons, Inc. (2009).
Weisbuch, F. et al.: "Assessing SEM contour based OPC models quality using rigorous simulation", Proc. of SPIE, vol. 9051 (2014).
Taiwanese Office Action issued in corresponding Taiwanese Patent Application No. 110144869, dated May 20, 2022.

* cited by examiner

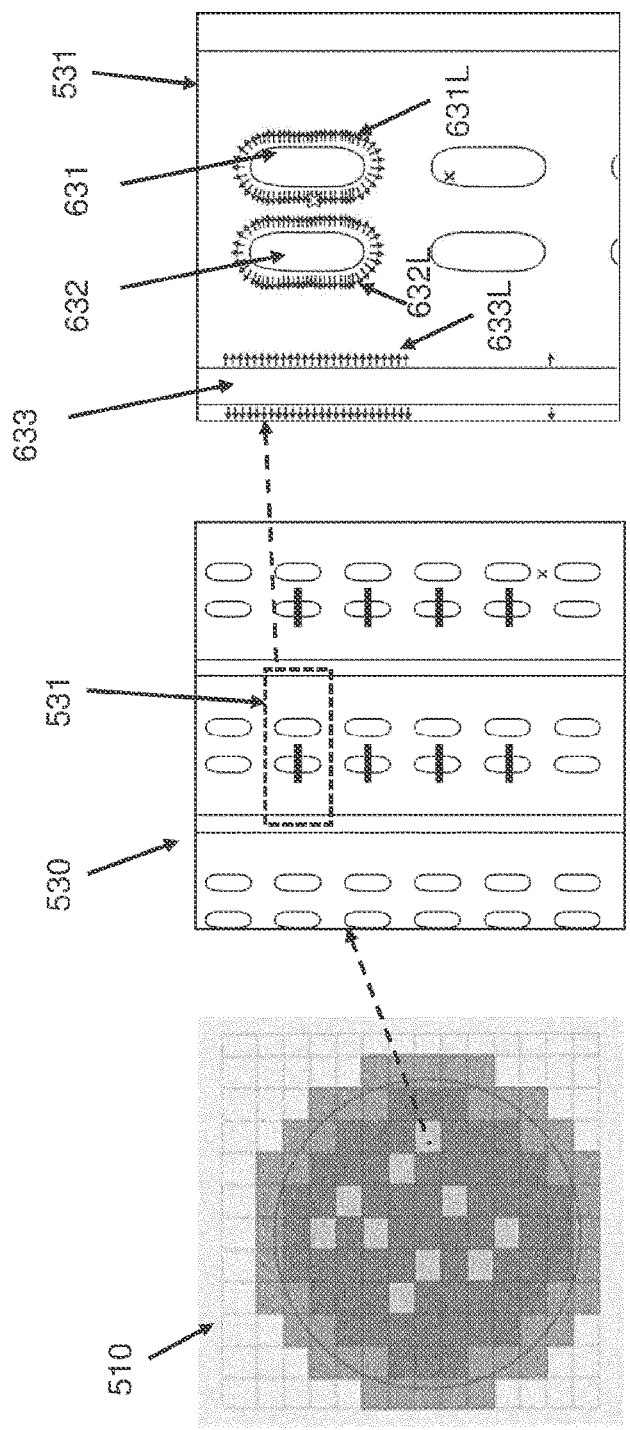

METHOD FOR DETERMINING STOCHASTIC VARIATION ASSOCIATED WITH DESIRED PATTERN

This application is a continuation of U.S. patent application Ser. No. 17/610,481, filed Nov. 11, 2021, which is the U.S. national phase entry of PCT patent application no. PCT/EP2020/061713, filed on Apr. 28, 2020, which claims the benefit of priority of U.S. patent application No. 62/850,838, filed on May 21, 2019, each of the foregoing applications is incorporated herein in its entirety by reference.

TECHNICAL FIELD

The description herein relates to lithographic apparatuses and processes, and more particularly to a tool to determine stochastic variations in printed patterns e.g., in resist layer on a wafer which can be used to model stochastic variation, detect defects on a wafer and optimize a patterning process such as a mask optimization and a source optimization.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a magnification factor M (generally <1), the speed F at which the substrate is moved will be a factor M times that at which the projection beam scans the pattering device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, microlithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet (DUV) or extreme-ultraviolet (EUV) illumination source, creating individual functional elements having dimensions well below 100 nm, i.e. less than half the wavelength of the radiation from the illumination source (e.g., a 193 nm DUV and 13.5 nm EUV illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm or 13.5 nm), NA is the numerical aperture of projection optics in the lithographic projection apparatus, CD is the "critical dimension"-generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus and/or design layout. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

In an embodiment, there is provided a method for determining stochastic edge placement error associated with a pattern to be printed on a substrate. The method includes acquiring, via a metrology tool, a plurality of images of the pattern at a defined location on the substrate without performing a substrate alignment therebetween; generating at least two data: (i) first data associated with the pattern using a first set of images of the plurality of images, and (ii) second data associated with the pattern using a second set of images of the plurality of images, wherein the first set of images and the second set of images include at least one different image; and determining (e.g., via a decomposition algorithm), using the first data and the second data associated with the pattern at the defined location, the stochastic edge placement error associated with the pattern.

Furthermore, in an embodiment, there is provided a method for determining edge placement error associated with a pattern to be printed on a substrate. The method includes defining a plurality of reference points around a contour of the pattern; defining a plurality of cut lines, wherein each cut line passes through a given reference point of the plurality of reference points in a normal direction to the contour of the pattern; determining a point of intersection of a given cut line with the pattern printed on the substrate; measuring a distance between the point of intersection and the given reference point; and combining the distance associated with each of the plurality of reference points around the contour of the pattern to generate the edge placement error associated with the pattern.

Furthermore, in an embodiment, there is provided a method for determining shrinkage in resist of a substrate caused due to measurement via a metrology tool. The method includes acquiring, via the metrology tool, a plurality of images of a pattern at a defined location on the substrate without performing a substrate alignment therebetween; generating at least two data: (i) first data associated with the pattern using a first set of images of the plurality of images, and (ii) second data associated with the pattern using a second set of images of the plurality of images, wherein the first set of images comprises at least two consecutive images of the plurality of images, and the second set of images comprises at least two different consecutive images of the plurality of images; and determining the shrinkage in the resist of the substrate based on a difference between the first data and the second data.

Furthermore, in an embodiment, there is provided a computer program product comprising a non-transitory computer readable medium having instructions recorded thereon, the instructions when executed by a computer system implementing the aforementioned method.

BRIEF DESCRIPTION OF THE DRAWINGS

Embodiments will now be described, by way of example only, with reference to the accompanying drawings in which:

FIGS. 5A, and 5B illustrate example of a printed substrate and first data (e.g., using a number of unit cells) associated with a die of a printed substrate having a desired pattern, respectively, according to an embodiment.

FIG. 6 shows an example of determining values of the EPE associated with features of a pattern of the unit cell of FIG. 5B, according to an embodiment.

Figure 1:
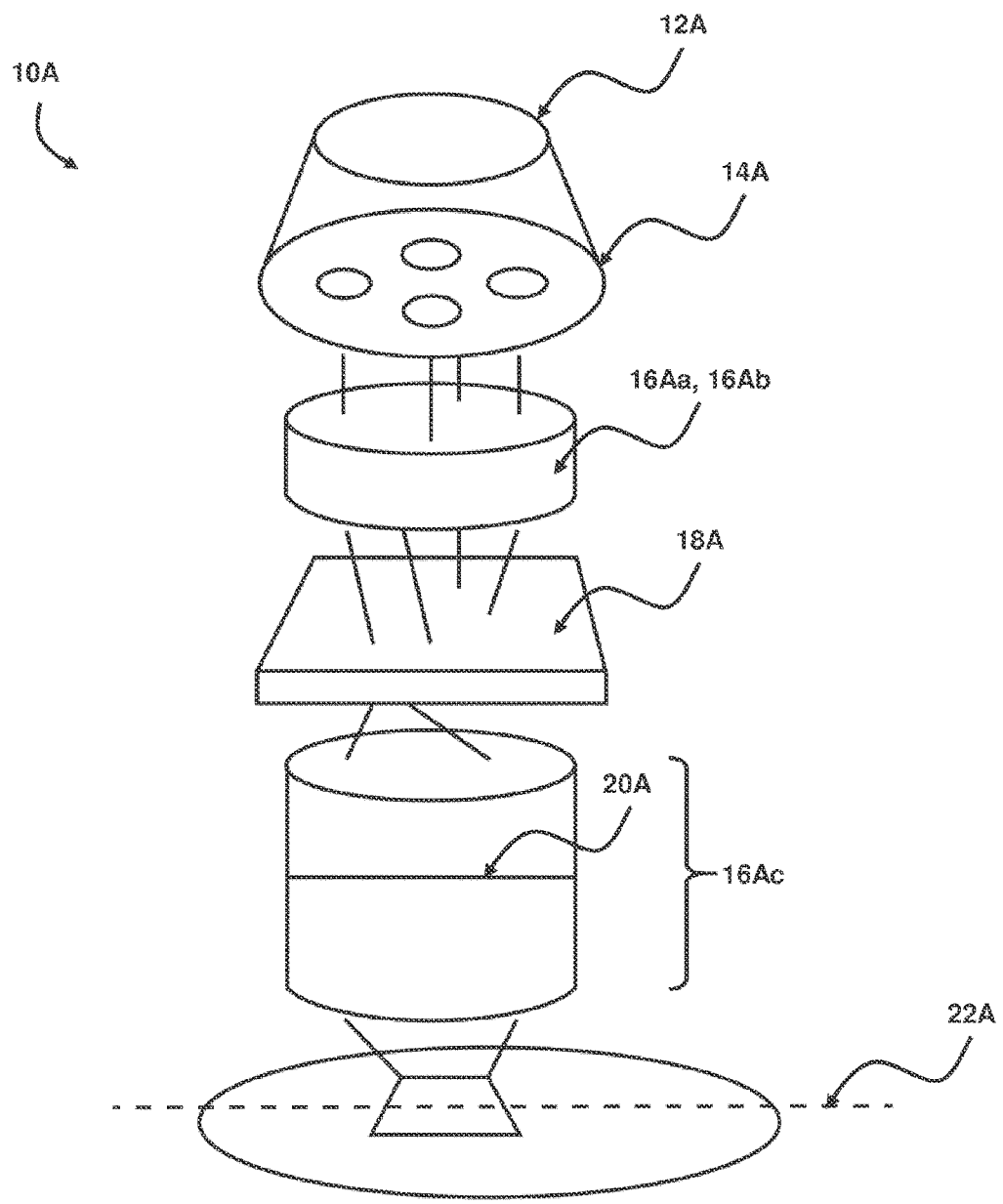
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results and/or processes of lithography have more desirable characteristics, such as higher accuracy of projection of design layouts on a substrate, larger process windows, etc.

Further, the lithographic projection apparatus may be of a type having two or more substrate tables (and/or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges and/or be interdependent due to practicalities of implementations of the system. In case of a lithographic projection apparatus, the constraints are often associated with physical properties and characteristics of the hardware such as tunable ranges, and/or pattering device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. patent application Ser. No. 12/315,849, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
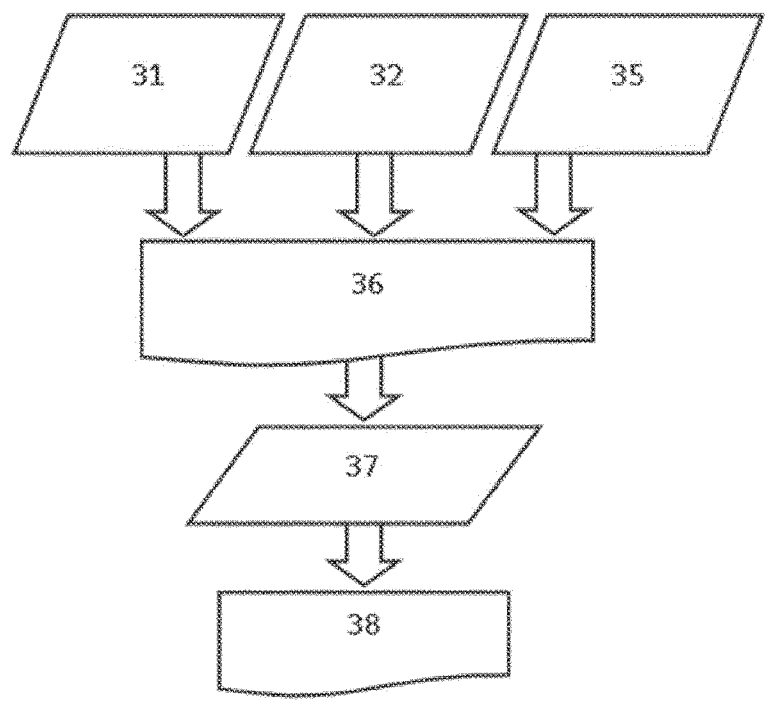
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution and/or phase distribution) of the source. A projection optics model 32 represents optical characteristics (including changes to the radiation intensity distribution and/or the phase distribution caused by the projection optics) of the projection optics. A design layout model 35 represents optical characteristics (including changes to the radiation intensity distribution and/or the phase distribution caused by a given design layout 33) of a design layout, which is the representation of an arrangement of features on or formed by a patterning device. An aerial image 36 can be simulated from the design layout model 35, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but not limited to, NA-sigma (σ) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (i.e. circuits, cells or patterns) of the design and especially the clips represent small portions for which particular attention and/or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual algorithm that identifies the critical feature areas.

Stochastic variations of the patterning process (e.g., resist process) potentially limits EUV lithography implementation for semiconductor high volume manufacturing (e.g., HVM) because of the combination of "few" photons per millijoule dose and preferred low dose processes, for example, in terms of shrink potential of features and exposure-dose specification, which in turn affects product yield or wafer throughput of the patterning process or both. In an embodiment, stochastic variations of a resist layer may manifest in different failure modes described by, for example, line width roughness (LWR), line edge roughness (LER), local CD non-uniformity, closed holes or trenches, and/or broken lines at the extreme condition. Such stochastic variations impact and limit successful high volume manufacturing (HVM). In order to characterize, understand and predict stochastic variation, the industry needs a trustworthy method to measure such variation for variety of design patterns.

Existing approaches of measuring stochastic variation involves different measurement techniques for different features. For example, line/space are measured in one direction (e.g., x or y), a contact hole or an array of contact holes patterns printed on a substrate may be measured in two directions (e.g., x and y). Based on such measurements, a performance metric (e.g., stochastic edge placement error (SEPE)) of the patterning process is determined at only limited locations (e.g., limited to one or two directions such as along x or y axis) for optimizing the patterning process. For easy readability, the methods are described with reference to stochastic edge placement error (SEPE) as an example, which is a performance limiter in EUV era. As an example of measures, a pattern measure is a line width roughness (LWR) (an example of one directional measurement), and a repeating dense contact array measure is local CD uniformity (LCDU) (an example of a two directional measurement).

In order to control, reduce and predict SEPE, the semiconductor industry needs a robust solution to measure SEPE accurately. The semiconductor industry does not have a unified solution to measure SEPE for both one and two directional measurement with the same algorithm. Currently, the industry measures LWR for a line and LCDU for repeating a contact array to estimate SEPE. Moreover, these measures only focus on pattern level (e.g., one number per pattern) but not on edge point level (e.g., points along a contour of a pattern) where a hot spot occurs.

As semiconductor technology node gets smaller, SEPE (stochastic edge placement error) associated with a desired pattern becomes a significant portion of overall edge placement error (EPE) budget. In an embodiment, the desired pattern refers to any pattern to be printed on a substrate, which when printed may be referred as a desired printed pattern. For example, the desired pattern corresponds to a design pattern such as contact hole, line and any irregular patterns found in a memory, logic or other IC circuits.

In semiconductor manufacturing, SEPE makes-up 40% of total EPE budget in N5 node (e.g., feature size approximately 5 nm), 50% of total EPE budge in N3 node (e.g., feature size approximately 3 nm). To enable high yield in smaller node, it is desired to model SEPE accurately and control SEPE efficiently to improve the yield (e.g., reduced defects in the printed pattern) of the patterning process.

In an embodiment, a metrology tool such as scanning electron microscope (SEM) is used to characterize the SEPE associated with the desired pattern. In SEM image data captured by the SEM tool noise is embedded therein. In an embodiment, SEM images may be overlapped to determine a contour band $\sigma_{LEPU}$ associated with the desired pattern, where LEPU stands for a measure called local edge placement uniformity (LEPU). In an embodiment, the term "local" refer to a particular area (e.g., a unit cell or a particular die. Accordingly, LEPU refers to edge placement measurements associated with the particular area (e.g., unit cell). In an embodiment, the overlapping SEM images from different dies at the same reticle positions consists of three contributors including: (i) SEM variation $\sigma_{SEM}$, (ii) mask related variation $\sigma_{mask}$ and (iii) stochastic variation $\sigma_{SEPE}$ (also referred as stochastic edge placement error). In the equation below, $\sigma_{LEPU}$ is the contour band (e.g., a total variation band associated with a pattern).

$$\sigma_{LBPU}^2 = \sigma_{SEPE}^2 + \sigma_{SEM}^2 + \sigma_{mask}^2$$

The mask error can originate from an error during mask manufacturing.

The stochastic variation or band (also called SEPE band) can originate from an uncertainty in substrate exposure and patterning process. For example, SEPE band due to the uncertainty of number of photons, the uncertainty of number of generated acid with the photons, and other resist development related effects.

In existing technology, the SEPE band can be extracted by decomposition method based on a linear nested model. For example, contact hole's local critical dimension uniformity (LCDU) has three contributions including SEM noise, mask error, and SEPE band. In an embodiment, LCDU data can be provided to the linear nested model to decompose the three contributions.

Figure 8A:
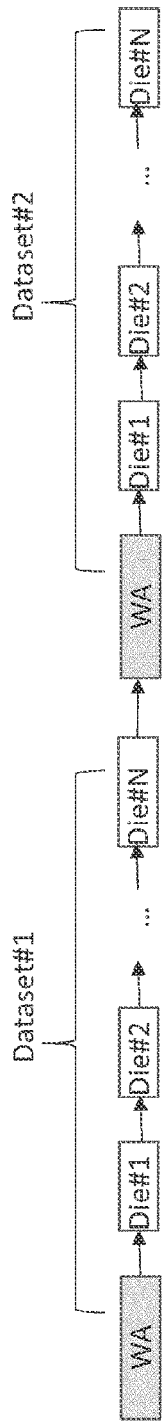
FIG. 8A is a flow chart of a traditional measurement approach, according to an embodiment.
Figure 8B:
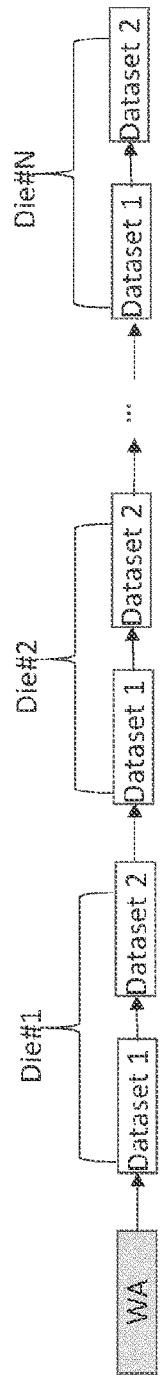
FIG. 8B is a flow chart of a proposed measurement approach, according to an embodiment.

In an embodiment, in order to prepare the data for the decomposition algorithm, the same SEM metrology recipe is used twice, and enable local alignment in recipe to reduce SEM measurement location offset among different measurement repeats (e.g., dataset 1 and dataset 2 associated with a first location of a die in FIG. 8B). Similar measurements may be performed among different dies. In an embodiment, anchor features (e.g., at a center of an area to be scanned) are usually included in the SEM's field of view (FOV) to help align SEM image among different measurements (and different dies).

In the present disclosure, the term "repeat" used with reference to measurement of a substrate refers to multiple measurements taken at a specified location of the substrate using a specified metrology recipe. For example, repeat data refers to acquiring a plurality of images at a first location (e.g., center of a specified die) on the substrate at a specified metrology recipe (e.g., landing energy, probe current, scan rate, etc.). In an embodiment, at least two repeat data are generated from the plurality of images. For example, a first repeat data (e.g., dataset 1 in FIG. 8B) and a second repeat data (e.g., dataset 2 in FIG. 8B), which is discussed in further detail below.

In existing approaches for SEPE band determination, the decomposition is often applied on critical dimension (CD) gauge measurement derived from the SEM images, where distances associated with only key features of a pattern are measured in one direction such as x or y. For example, CD gauge is measured as a distance between two points in one direction only, typically along either horizontal or vertical direction. However, the CD gauge based SEPE band only covers a couple of locations along the contour, which is not sufficient for SEPE band modeling of arbitrary patterns. On the other hand, according to the present disclosure, the EP gauge is measured in multiple directions with respect to a reference. For example, EP gauge is measured as a distance between a point of interest on a desired contour and a reference point along line at a specific angle (e.g., normal to contour). Such multi-directional measurement data enables accurate measurement of an arbitrary pattern (e.g., see EP gauges in FIGS. 7A and 7B), as arbitrary patterns cannot be simply described by measurements in x or y direction only.

The disadvantages of existing technology include, but not limited to, following. There exists a large (x,y,z) placement offset between any two measurement repeats. For example, when running the SEM metrology recipe multiple times, the recipe has to perform global and local alignment (e.g., wafer alignment) for each recipe run. Even with local alignment (which the reduces measurement throughput), the typical (x,y) placement error is approximately 10 nm. There exist a large variation in a time lag difference associated with the same die location, therefore large SEM-shrinkage uncertainty associated with resist of the substrate being measured. For example, when running the SEM metrology recipe twice, it is also hard to control the time lapse between a first measurement repeat and a second measurement repeat among different dies. The time lapse increases the shrinkage uncertainty between two measurement repeats. This shrinkage uncertainty will degrade the accuracy of the decomposition result such as SEM noise $\sigma_{SEM}$, mask error $\sigma_{mask}$, and stochastics variation $\sigma_{SEPE}$. There exist longer data acquisition time and higher chance of wafer damage. For example, to acquire a good quality SEM image at the defined locations on substrate, the metrology tool has to perform focus adjustment, global and local alignment for each recipe run. This leads longer acquisition time, and more chance for wafer damage. When running focus and local alignment with SEM beam, SEM beam can damage the wafer surface.

Furthermore, the SEPE band calculation is based on limited number of locations along the contour. For example, existing technology is using CD gauge for SEPE band decomposition of contract hole feature, a bar, line space feature, etc. A CD gauge is defined at the limited locations along the contour of the feature. For example, CDx and CDy are CD gauge at x direction and y direction for whole contact hole. For complex arbitrary feature, SEPE band from CD gauge does not describe the entire contour's SEPE band. Instead, EP gauge, described herein, provides relatively higher coverage of the contour compared to the CD gauge.

The present disclosure extends CD gauge to EP gauge, and defines a new measurement sequence. Also, the decomposed SEPE band covers approximately full two-dimensional contours, whose SEM images are acquired by the metrology tool such as HML tools with large FOV and high throughput.

Some of the advantage of the present methods (e.g., methods 300, 800, etc. described herein) are improved accuracy of SEPE band extraction with less metrology measurement time and less wafer damage compared to existing methods. The method extends the SEPE band extraction from CD gauge to EP gauge, so that SEPE band along full contour of arbitrary two-dimensional patterns can be modeled. This SEPE band for arbitrary pattern enables a computational lithography software (e.g., Tachyon models) to simulate SEPE band at any location of the mask patterns. The method enables accurate SEPE model fitting with large amount of SEPE band data at EP gauge locations (which can be e.g., 100 times of CD gauge data).

In an embodiment, the method uses a large FOV and high-throughput SEM tool (such as HML), which can acquire SEM images covering large wafer area with short time and can enable fast SEPE band calibration and verification.

Figure 3:
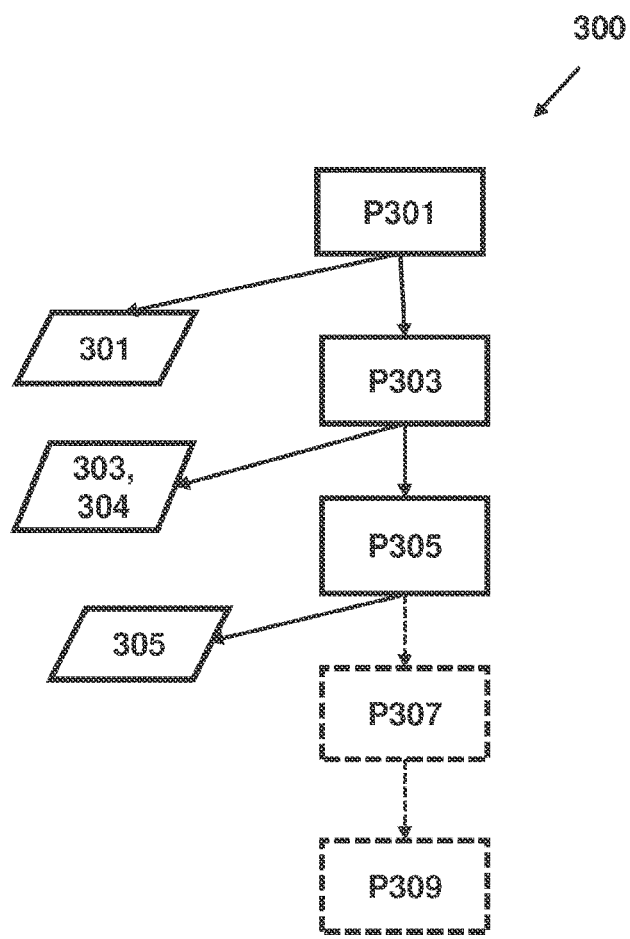
FIG. 3 is a flow chart of a method for determining stochastic edge placement error associated with a pattern to be printed on a substrate, according to an embodiment.

FIG. 3 is a flow chart of a method 300 for determining stochastic edge placement error associated with a pattern to be printed on a substrate. The method 300 determines the stochastic edge placement error based on data obtained from the metrology tool in a certain sequence (e.g., see FIG. 8B). The data is associated with a pattern at a defined location. In an embodiment, the data includes a plurality of images of the patterns at the defined location acquired without moving to a second location, thereby no need of a wafer re-alignment. For example, a plurality of images of the same location within a particular die is obtained using a single metrology recipe.

The proposed method preprocess consecutive images from single measurement repeat (e.g., acquiring a plurality of images using the same metrology recipe without moving to a second location) into more than two dataset that is further provided to a decomposition algorithm configured to determine stochastic variations associated with, for example, mask, SEM tool, and SEPE. An example of preprocessing N consecutive images of a single repeat to generate data equivalent to at least two set of measurement repeat data. For example, the two measurement repeat data can be generated by combining all odd numbered images into repeat #1 data, and combining all even numbered images into repeat #2 data. In a more general case, the repeat #1 and repeat #2 data can be combining of any number of the image in any order, as long as at least one of the image is different among the two repeat data. For example, if total N consecutive images are acquired at one substrate location, then the repeats #1 data can be generated by combining $1^{st}$ image to the [N/2]th image, and the repeat #2 can be generated by combining the rest of images. If N is odd number, [N/2] is the round-up integer.

The advantages of the present method 300 include, but not limited to following. First, a placement error (e.g., in x,y direction) associated with the metrology tool between repeats (e.g., repeat #1 and repeat #2) is minimal. For example, the (x,y) placement error among the repeats is the same as the placement error associated with consecutive images, which can be approximately 1 pixel size.

Thus, with the present method(s), a placement error associated with the metrology tool is substantially less than the placement error (e.g., 10 nm) resulting from a global and local wafer alignment required in the existing approaches. Furthermore, the z position (e.g., focus position of the metrology tool with respect to the substrate) among the repeats (e.g., repeat #1 and repeat #2) is the same as focus repeatability among the consecutive images. So, the focus repeatability in the present method is much better than the focus repeatability between different recipe runs of the existing approaches. Hence, in present method variability resulting from re-focusing of the metrology tool is minimum to non-existence.

Secondly, a time lag difference between repeats (e.g., repeat #1 and repeat #2) is minimal. In an embodiment, the time lag difference depends on a dwell time of a pixel. For example, if the scanning speed of the metrology tool is 10 MHz, each pixel dwelling time is 0.1 us, then 10 times the dwelling time gives as time lag difference of 1 us. In an other example, if the scanning speed is 100 MHz, then each pixel dwelling time is 0.01 us, then 10 times dwelling time gives a time lag difference of 0.1 us. In an embodiment, the dwell time is the time a focused e-beam rests at a point (characterized by a single pixel) on the substrate being measured and illuminates it. Therefore, the longer the dwell time, the more photons can be collected per pixel, and the lower the scan speed will be.

The time lag difference can cause unpredictable wafer shrinkage difference, because wafer shrinkage is nonlinear function of time. Therefore, shrinkage uncertainty of a wafer caused due to use of the SEM tool multiple times is minimized. In the present method, the time lag difference between the repeats is the same as the time lag difference among the consecutive images, which is in sub-microsecond level (e.g., single-digit or double-digit nano seconds). On the other hand, the time lag difference in two recipe run level of existing approaches is much larger (e.g., which can be sub-second level) compared to the present method.

Thirdly, the present method requires less SEM metrology time and causes less wafer damage compared to the existing approaches. Acquiring SEM images with single metrology recipe (e.g., used in the measurement repeat) run can eliminate a global and local wafer alignment and refocusing time that is required in the traditional $2^{nd}$ metrology recipe run. Refocusing and local alignment uses SEM beam, which can damage the wafer. So using single repeat acquisition can save SEM metrology time and reduce wafer damage.

The above advantages lead to more accurate SEPE band calculation with less metrology time compared to existing approaches. Besides obtaining more accurate SEPE band, this approach can also provide more accurate metrology noise/variation (e.g, SEM noise) and mask related variation/error. For example, the method is discussed in more detail with respect to the procedures P301, P303, and P305 as follows.

Procedure P301 involves acquiring, via a metrology tool, a plurality of images 301 of the pattern at a defined location on the substrate consecutively without performing a substrate alignment therebetween. For example, as discussed in FIG. 8B, image numbers 1, 2, 3, 4, . . . 16 are acquired in a consecutive manner at the defined location without performing a wafer realignment between image number 1 and 2, 1 and 5, 1 and 16, 2 and 16, or other possible combinations. In SEM metrology, the term "image" (e.g., 16 images) is also referred as "frame" (e.g., 16 frames). In an embodiment, the plurality of images are acquired without acquiring an image of the pattern at a second location on the substrate. In an embodiment, the metrology tool acquires each of the plurality of images 301 using a single metrology recipe. The metrology recipe comprises a field of view and positioning information associated with the location on the substrate. In an embodiment, the metrology tool is a scanning electron microscope (SEM) and the plurality of images 301 are SEM images. In an embodiment, an image of the plurality of images 301 is a pixelated image.

In an embodiment, the acquiring of the plurality of images 301 of the location involves aligning the substrate with the metrology tool, and acquiring each of the plurality of images 301 of the pattern at the defined location in a first die of the substrate without acquiring an image in a second die of the substrate.

In an embodiment, since the plurality of images 301 are acquired at the defined location without performing a substrate alignment therebetween, the first data 303 and the second data 301 has a placement error of approximately 1 pixel size. The placement error being associated with positioning of the metrology tool at the defined location on the substrate.

For example, when acquiring an image (e.g., $1^{st}$ image) of the plurality of the images, the SEM tool scans (e.g., zig-zag manner) an area around the defined location. When acquiring a consecutive image (e.g., $2^{nd}$ image) the SEM tool is re-positioned to the starting position of the $1^{st}$ image. Such re-positioning is referred as a placement error. In existing approaches, the SEM tool acquired images at different locations of different dies before coming back to the starting position of the $1^{st}$ die. When measuring the $1^{st}$ die again, a significant time has elapsed, and the substrate may have moved which causes much larger positioning or placement error compared to proposed measurement approach. In an embodiment, when a SEM tool is used for measuring a substrate printed via a EUV lithographic tool, a pixel size may be approximately 1 nm.

However, the method is not limited to SEM tool nor a particular lithographic tool. For example, the method can be also used for substrate printed using a DUV lithographic tool and different SEM tools. Hence a placement error is defined in terms of pixel size. For example, the placement error may be between 1 to 2 pixel size level.

In an embodiment, the first data 303 and the second data 304 has a time lag difference of less than 1 μs. As mentioned earlier, the time lag difference is associated with a dwelling time of a pixel of a given image acquired by the metrology tool. For example, since the plurality of images 301 are acquired at the defined location (e.g., in $1^{st}$ die) without acquiring images at the second location (e.g., in the $1^{st}$ die or a $2^{nd}$ die), the SEM tool has to move relatively less distance. Hence, a time lag difference between consecutive images is relatively low. Thus, reducing variation effects caused due to wafer shrinkage. Hence, the first data 303 and the second data 304 has relatively less variations associated with substrate development over time as well as variation associated with interaction between metrology tool and substrate.

In an embodiment, the first data 303 and the second data 304 is generated without refocusing of the metrology tool, and/or without re-alignment of the substrate during measuring by the metrology tool. As mentioned earlier, the SEM tool acquires, for example, multiple images at the same location (e.g., of a $1^{st}$ die) before acquiring images at the second location (e.g., in the $1^{st}$ die or $2^{nd}$ die), the substrate related deformation is minimum and hence, re-focusing may not be necessary. Furthermore, a re-alignment of the SEM tool at the defined location may not be necessary. For example, the re-alignment involves identifying/matching position markers of the substrate with the metrology tool to identify the defined position on the substrate and to ensure proper alignment. Such re-matching/re-alignment of with the position markers may not be necessary since substrate deformation is minimum between consecutive measurements (e.g., images).

In an embodiment, the acquiring of the plurality of images 301 of a desired printed pattern for generating first data 303 (also referred as repeat #1) and the second data 304 (also referred as repeat #2) is further illustrated in FIG. 8B. FIGS. 8A and 8B compares examples of existing measurement process and the proposed measurement process, respectively.

In a traditional approach, FIG. 8A shows that a wafer alignment WA is performed followed by acquiring a plurality of images of a desired printed pattern from die #1, die #2, . . . die #N of the substrate. These images are further used to generate first data (dataset #1 or repeat #1). Further, a second wafer alignment is performed before acquiring the images from die #1, die #2, . . . die #N of the substrate to generate the second data (dataset #2 or repeat #2). Thus, wafer alignment is performed twice between the first data and the second data. Likewise additional wafer alignments will be required to generate a third data, fourth data, and so on. In an embodiment, multiple metrology recipe may be needed for different dies. Thus, after measuring the die #1, die #2, . . . , die #N, the metrology tool needs adjustments to return to recipe associated the die #1 when re-measuring die #1 to generate the second data. As discussed earlier, acquiring data in this manner has higher time lag difference, positioning error and shrinkage uncertainty associated with the first data and the second data compared to the measurements according to FIG. 8B used in the present method(s).

On the other hand, in the FIG. 8B, a wafer alignment WA is performed only once in the beginning of the acquiring of a plurality of images of the desired printed pattern from die #1 (e.g., a defined location of die #1). Then the images of the die #1 are further used to generate first data 303 (dataset #1 or repeat #1) and the second data 304 (dataset #1 or repeat #2). Thereafter, in a similar manner, additional multiples images of a desired printed pattern may be acquired from die #2, . . . , and die #N. In this manner, the first data 303 and the second data 304 is associated with the defined location. As discussed earlier, acquiring data in this manner has substantially less time lag difference, positioning error and shrinkage uncertainty associated with the first data 303 and the second data 304 compared to the measurements according to FIG. 8A.

In an embodiment, after acquiring the plurality of images 301 the defined location on the substrate, then acquiring a second plurality of images at a second location on the substrate. The data associated with the second location can be acquired and used in a similar manner as data associated with the first location, as discussed in procedures P301, P303, P305, P307, or other procedures using the data acquired by the metrology tool.

Procedure P303 involves generating at least two data: (i) first data 303 associated with the pattern using a first set of images of the plurality of images 301, and (ii) second data 304 associated with the pattern using a second set of images of the plurality of images 301, where the first set of images and the second set of images include at least one different image. It can be understood that the first data 303 and the second data 304 are examples and does not limited the scope of the present disclosure. In an embodiment, more than two data may be generated by dividing the plurality of images 301 into sub-sets in a similar manner.

In an embodiment, the generating of the first data 303 and the second data 304 involves selecting the first set of images of plurality of images 301 and the second set of images of plurality of images 301 that is different from the first set of images; overlapping the first set of images; determining values of edge placement errors using the overlapped first set of images to generate the first data 303; overlapping the second set of images; and determining values of edge placement errors using the overlapped second set of images to generate the second data 304.

FIGS. 5A, and 5B illustrate a printed substrate 510 and an image 530 which is an example of first data 303 (e.g., repeat #1). The image 530 is collected at a specific location comprising a desired pattern within a die of a printed substrate 510. In an embodiment, the first data 303 (e.g., 530) may include a set of images (e.g., SEM images), and/or a number of unit cells associated with a desired pattern. In an embodiment, an average of the set of images may be computed to generate the first data 303. In an embodiment, the area covered by the set of images may depend on the FOV of the SEM tool. For example, in FIG. 5B, the set of images may be include portions around a center (an example of a specified location used for SEM measurement) of the die, where the SEM's FOV is large enough to capture an area around the defined location (e.g., the center of the image 530 in FIG. 5B). Similarly, data may be acquired at different specified locations within a particular die, where each location is scanned at a specified metrology condition/recipe. In addition, data may be acquired from different dies as discussed above. The acquired data may be further divided to generate the first data and the second data, as discussed in FIG. 3.

Furthermore, in an embodiment, the first data (e.g., repeat #1) may include a plurality of images associated with a unit cell. In an embodiment, the unit cell is defined as a unique arrangement of a set of features of a design pattern. Such unit cell may be characteristic of the design pattern and may appears at multiple locations within a particular die and by extension at several locations on the substrate. Hence, within an image of a desired printed pattern there may be several unit cells. For example, see FIG. 5B, a unit cell may include feature arranged as shown in a unit cell 531.

In an embodiment, the first set of images and the second set of images include all different images of the plurality of images associated with the defined location. In an embodiment, each image of the plurality of images is acquired consecutively so that the time lag difference between consecutive images and a positioning error of the metrology tool are minimized. For example, a SEM tool with a first FOV and a single metrology recipe captures 16 images one after the other (i.e., consecutively). In an embodiment, the first set of images includes even numbered images (e.g., images 2, 4, 6, 8, 10, 12, and 14) and the second set of images include odd numbered images (e.g., images 1, 3, 5, 7, 9, 11, 13, and 15).

In an embodiment, the determining a value of an edge placement error involves defining a plurality of reference points around a contour of the pattern; defining a plurality of cut lines, each cut line passing through a given reference point of the plurality of reference points in a normal direction to the contour of the pattern; determining a point of intersection of a given cut line with the pattern in a given image of the plurality of images; and measuring a distance between the point of intersection and the given reference point, wherein the edge placement error comprises the measured distances associated with each image of the plurality of images.

FIG. 6 shows an example of determining values of the EPE associated with features of a pattern of the unit cell 531 (e.g., in FIGS. 5B and 6). For example, the EPE values are determined at a plurality of locations collective referred as points 631L (or 632L/633L) marked around the feature 631 (or 632/633) of the unit cell 531. An example of the determining of the edge placement error values (e.g., dist2EPbase associated with each reference point around a reference contour) is further illustrated and discussed with respect to FIGS. 7A and 7B.

Procedure P305 involves determining, using the first data 303 and the second data 304 associated with the pattern at the defined location, the stochastic edge placement error 305 associated with the pattern.

In an embodiment, the determining the stochastic edge placement error 305 involves executing a decomposition algorithm using the first data 303 and the second data 304. In an embodiment, the decomposition algorithm determines a first variation associated with the metrology tool using the first data 303, the second data 304, and values of edge placement errors across the substrate; and further determines a second variation associated with the pattern based on the first data 303, the second data 304, and the first variation.

Figure 7A:
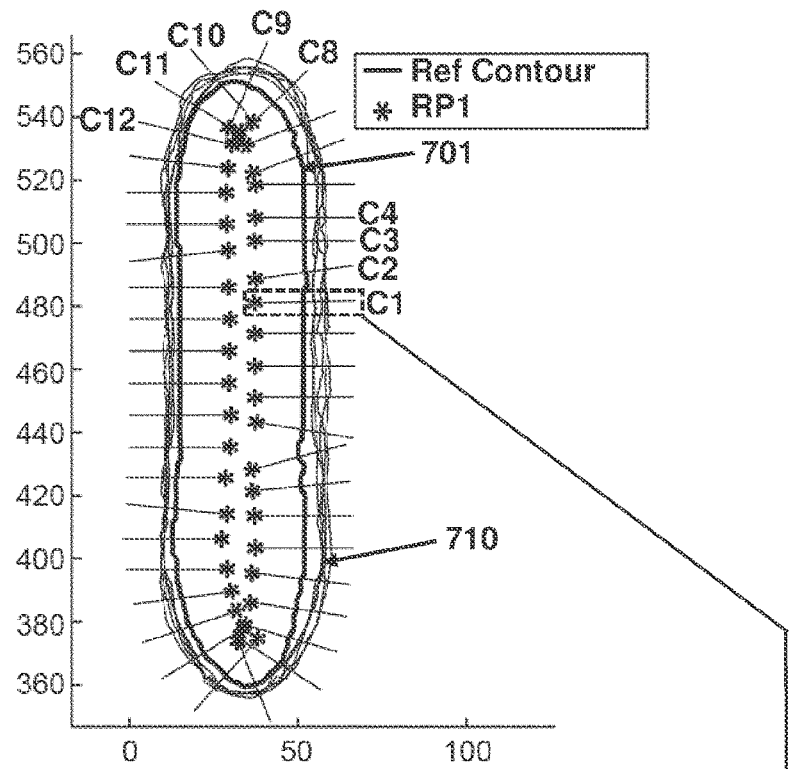
FIG. 7A shows a set of extracted contours of the plurality of images overlapped with each other, according to an embodiment.
Figure 7B:
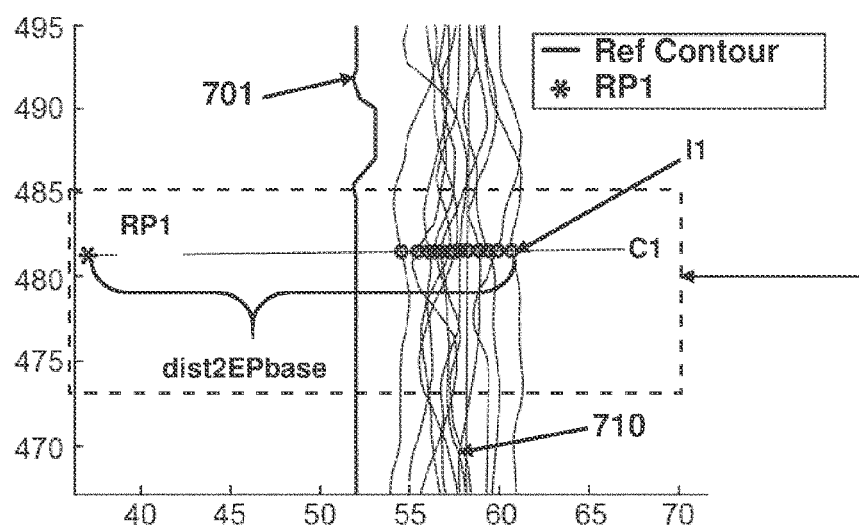
FIG. 7B shows example cut-line and intersection points with extracted contours, according to an embodiment.

In an embodiment, the edge placement error is measured as dist2EPbase as shown in FIGS. 7A and 7B. The dist2EPbase values are further used to determine, via a decomposition algorithm, variation data such as $\sigma_{SEM}^2$, $\sigma_{SEPE}^2$, and $\sigma_{mask}^2$. In an embodiment, such variation data is further used to improve, for example, mask pattern, process conditions of the patterning process, etc.

In an embodiment, the measured data (e.g., st2EPbase) may be arranged in three levels. A first level of data refers to data collected at the same metrology condition at least twice, which can help remove metrology noise. A second level of the data is data associated with the same mask used to expose at multiple die, then a die-to-die difference indicate stochastic errors. A third level of data refers to data associated with multiple unit cells within a die, and difference in data among the unit cells indicate the mask error.

In an embodiment, the decomposition algorithm is based on a linear nested model (e.g., discussed in detail in "Design and Analysis of Experiment") configured to decompose the dist2EPbase values into three components $Q_{SEM}^2$, $\sigma_{SEPE}^2$, and $\sigma_{mask}^2$.

In an embodiment, the linear nested model assumes a set of measured edge placement errors $EPE^{is}$, wherein i=1 . . . N, and s=1 . . . S; where N represents number of unit cells in an image and S is number of measurement repeats. In an embodiment, the edge placement errors are measured as dist2EPbase. Accordingly, the variance associated with the dist2EPbase will be same as the variance of the EPE.

In an embodiment, a list of variables/indices used in the linear nested model are explained as follows: s: the measurement dataset (e.g., the first data 303 and the second data 304) generated from the plurality of images at the same wafer (x,y) location, s=1 . . . S, S is the number of the measurement dataset (e.g., 2); t: the unit cell index in one die, t=1 . . . T, T is the number of sampled unit cells in the die; and j: unique gauge location in an image, j=1 . . . J. In embodiment, a unit cell refers to a portion of a desired printed pattern. The variance of any EPE (e.g., dist2EPbase) measurement is obtained as a sum of variances $\sigma_{SEPE}$, $\sigma_{SEM}$, and $\sigma_{mask}$.

For example, the decomposition algorithm calculates Mean of Squares (MS) of SEPE, SEM and mask using the first level data, the second level data and the third level data. Based on the mean of squares, the algorithm calculates variance $\sigma^2$ of SEPE, SEM and mask.

In an embodiment, the method further involves (e.g., in procedure P307 involves) determining an intensity log slope of an aerial image of the pattern; and determining, based on the stochastic edge placement error 305 associated with the pattern and the intensity log slope, a model configured to predict stochastic variation in an edge placement at any point on a contour of the pattern. In another example, the SEPE model configured to predict the SEPE band may be based on other patterning related parameters such as the intensity log slope, CD change per dose change (also called dCD/dDose or dose sensitivity). For example, $\sigma_{SEPE}$ is represented as a linear (or non-linear) function of d(CD)/d (Dose) and the associated parameters may be determined based on the $\sigma_{SEPE}$ data obtained from the decomposition algorithm discussed above.

In an embodiment, the method further involves (e.g., in procedure P309 involves) determining optical proximity corrections for a mask associated with the pattern to be printed on the substrate based on the stochastic edge placement error 305.

Figure 4:
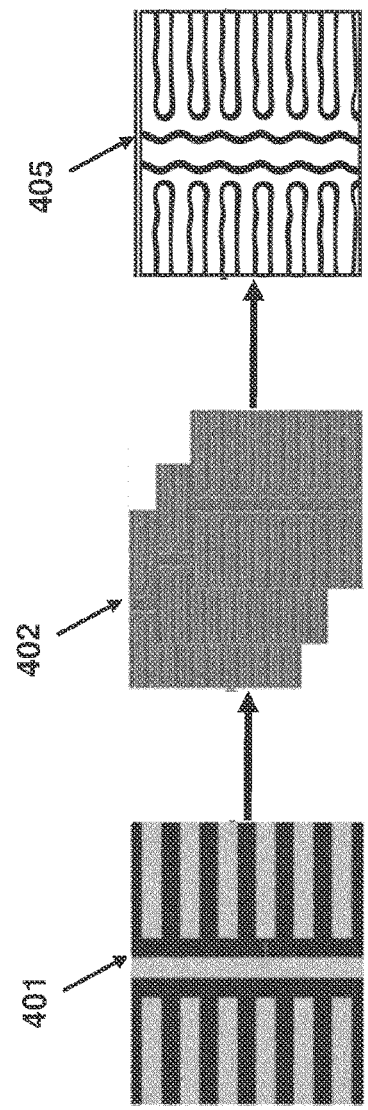
FIG. 4 illustrates an example of stochastic variation band, according to an embodiment.

FIG. 4 illustrates an example of stochastic variation band derived from printed patterns captured in raw images and an example stochastic variation band determined based on the edge placement error values (as discussed above in FIG. 3 and FIGS. 7A and 7B) determined from the raw images.

In FIG. 4, a reference pattern 401 may be received (e.g., via a processor 104), for example, in a form of GDS/OASIS file format, which is a different format than the SEM image format. Accordingly, coordinates or locations of a pattern in the images and the GDS format will be different. In an embodiment, the reference pattern 401 may be a design layout, or a simulated layout obtained as an output of a process simulation. The reference pattern 401 comprises a plurality of features that are desired to be printed on the substrate imaged via a lithographic apparatus. In the present example, the reference pattern 401 comprises horizontal lines of certain pitch, and vertical lines of another pitch. In another example, the reference pattern 401 may include contact holes or other geometric structures corresponding to IC to be printed on the substrate.

The reference pattern 401 may be printed at different location on the substrate. For example, the reference pattern 401 may be printed at different locations within a particular die, and/or across different dies on the substrate. For example, a printed substrate may include thousands or even millions of instances of printed patterns corresponding to the reference pattern 401. In an embodiment, images of the printed substrate may be obtained, via a metrology tool (e.g., SEM, optical tools, or other image capturing tools). Typically, such images of the substrate are obtained for measuring a characteristic (e.g., CD, EPE, etc.) of the printed pattern, inspecting quality of printed patterns, identifying faults in printed patterns, hot spots, etc.

Figure 11:
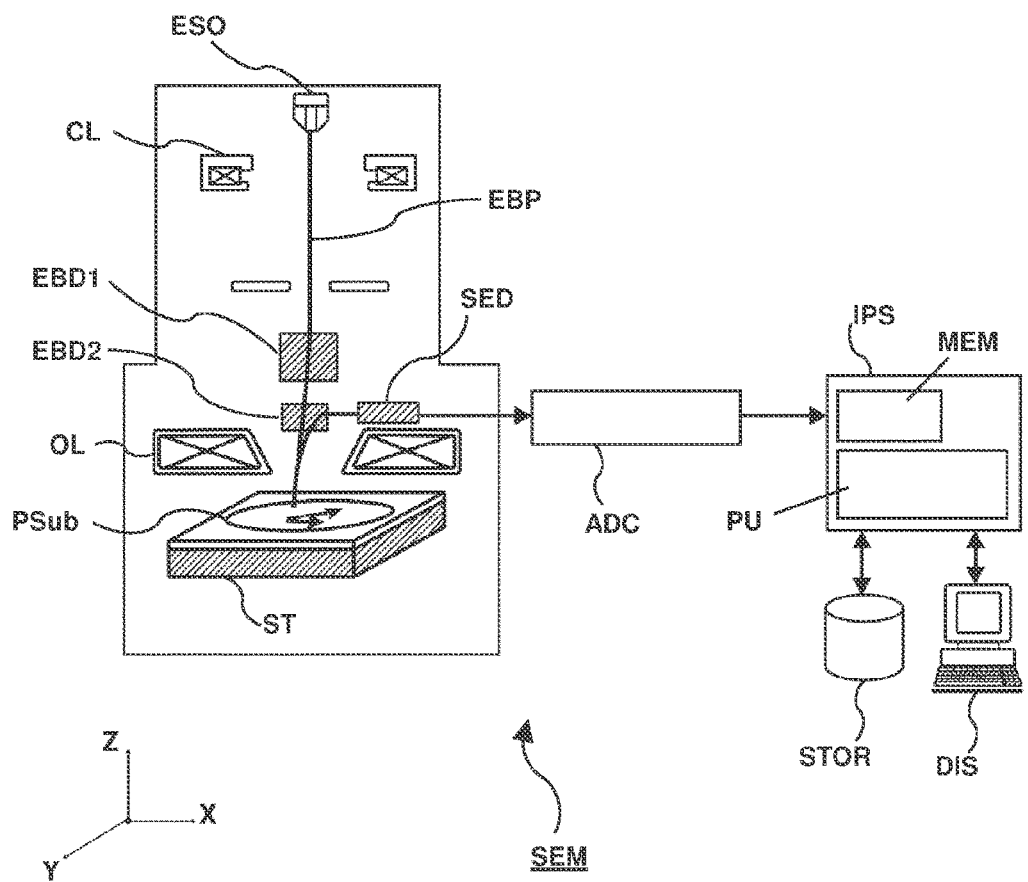
FIG. 11 schematically depicts an embodiment of a scanning electron microscope (SEM), according to an embodiment.
Figure 12:
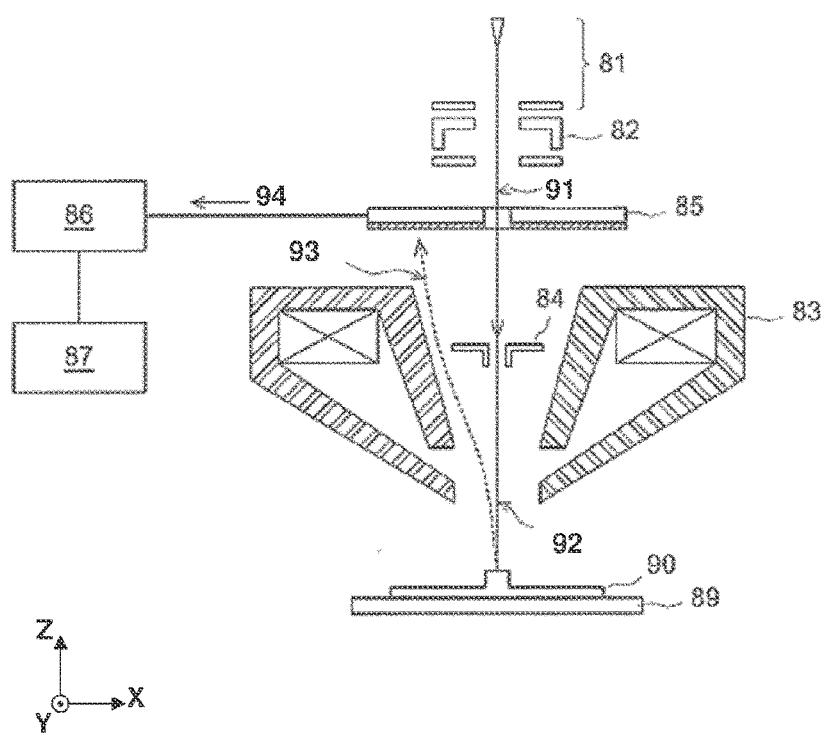
FIG. 12 schematically depicts an embodiment of an electron beam inspection apparatus, according to an embodiment.

A plurality of images 402 (also referred as raw images 402 for better readability are examples of images 301) corresponding to the reference pattern 401 are obtained, for example, via SEM tool (e.g., discussed in FIGS. 11-12). In an embodiment, a first plurality of images are captured from a first die, a second plurality of images are captured from a second die of the substrate, and so on. Each such images include the printed pattern corresponding to the reference pattern 401. For example, the printed patterns include horizontal lines and vertical lines corresponding to the reference pattern 401. However, the printed patterns in the raw images 402 may be inconsistent, distorted, and/or include variations induced due to the patterning process, the measurement process via the metrology tool (e.g., SEM tool), and/or other variations associated with the patterning process.

In an embodiment, the raw images 402 are distorted, fuzzy, and/or include a noise component, which makes it difficult to accurately identify a printed pattern's shape, size, and/or a contour. Although, a de-noising filter may be applied to partially or completely remove noise from the images, determining of the contour and corresponding measurements therefrom may be inaccurate as SEM measurement process itself may involve process inaccuracy such as an e-beam may affect the resist during capturing of the substrate image thereby capturing a distorted image.

From the raw images 402, contours of the printed pattern may be extracted and overlapped with each other to determine a variation band (e.g., band 405) of the printed patterns. The variation band indicates that the reference pattern 401 is not printed uniformly or has varied dimensions/shape at different locations of the substrate. This band is an estimate of the total variation. Part of such variation is due to the stochastic variations, the other parts are coming from the patterning process and/or the measurement process (e.g., in the SEM tool or other metrology tool). Thus, each variation information (e.g., a stochastic variation, inter-die variation, intra-die variation and so on) related to each of the raw images 402 is decomposed and retrieved. In an embodiment, the stochastic variation band 405 is the SEPE band determined based on images obtained as discussed in the method 300 above.

In an embodiment, as shown in FIGS. 7A and 7B, measurements may be performed on the stochastic variation band 405. Determining the measurements (e.g., EPE) involves defining cut-lines and reference points around the contour. In embodiment, the measurement is a distance between a reference point and a intersection point of the cut-lines and the contour of an image.

FIG. 7A shows a set of extracted contours 710 of the plurality of images overlapped with each other. The extracted contours 710 are further overlapped with the reference contour 701 which is further associated with a set of reference points RP (each star point is a reference point). In an embodiment, the reference contour may be defined based on a contour associated with an aerial image obtained via simulation of a patterning process model (e.g., optics model of Tachyon software). In an embodiment, the reference contour may be obtained from an averaged images associated with the desired pattern over all dies. For measurements, different cut-lines are defined such that each cut line passing through the reference points and is normal to the reference contour. Such cut-lines will be multi-directional and can be applied to measure any contour having any arbitrary shape. For example, the cut-lines C1-C4 (in 7A) are normal to the reference contour. In embodiment, the cut lines need not be horizontal or vertical, but can be angular cut-lines originating from the reference points, as shown. Each cut line can be extended to intersect the extracted contours 710. An example of intersection is show in FIG. 7B which is an enlarged portion of FIG. 7A.

In FIG. 7B, the cut-lines C1 intersect with the contour 710a at point I1. Then, a distance (e.g., dist2EPbase) between the reference point RP1 and the point I1 is defined as the edge placement error. In other words the contour 710a does not exactly overlap with the reference contour. Hence, the placement of the printed contour 710a is not as desired, as such considered as an edge placement error. Ideally, the printed contour should overlap with the reference contour 701. Also, notice that the edge placement error varies along the contour. For example, at some locations, the edge placement of the printed contour is relatively close to the reference contour 701 while at some locations the printed contour is further away. The proposed measurement approach provides more accurate EPE measurement data as it can cover any arbitrary pattern as well as provides a common reference points for contours of the plurality of images. Such EPE data is further used to in the decomposition algorithm to determine the stochastic variation (e.g., SEPE) as discussed herein.

Figure 9:
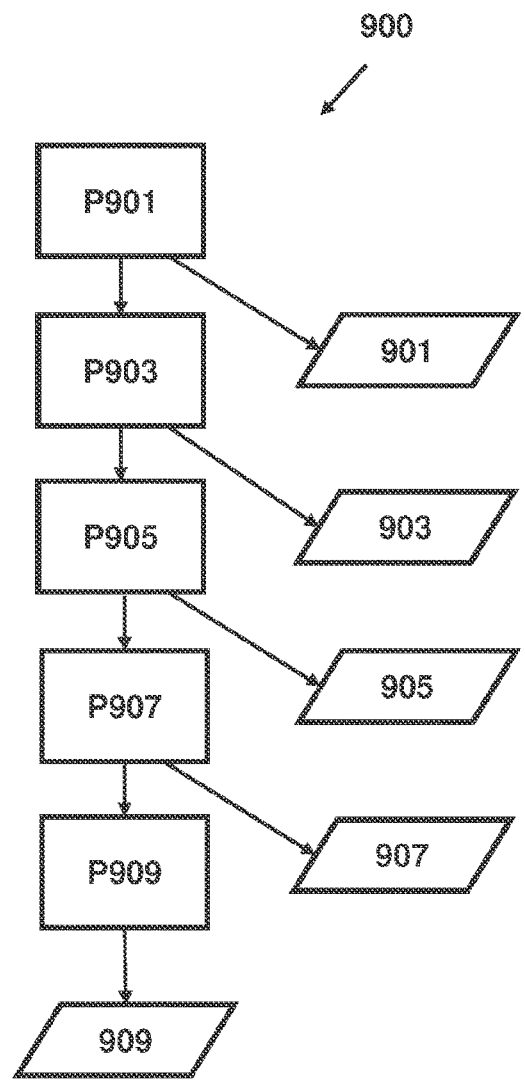
FIG. 9 is a flow chart of a method for determining edge placement error associated with a pattern to be printed on a substrate, according to an embodiment.

Referring to FIG. 9, there is provided a method 900 for determining edge placement error associated with a pattern to be printed on a substrate. An example of the method is discussed with respect to FIGS. 7A and 7B. Furthermore, example procedures P901-P909 of the method 900 to determine edge placement error are discussed as follows.

Procedure P901 involves defining a plurality of reference points 901 around a contour of the pattern. For example, in FIG. 7A, a plurality of reference points RP (example of 901) are defined around a reference contour 701. The reference points are also referred as base points, such base points serve as a common location for performing measurements with respect to contours (e.g., 710) extracted from the dataset (e.g., dataset 1 and dataset 2 as discussed in FIGS. 3 and 8B). In an embodiment, the reference points may be located anywhere around the reference contour, but as long as the cut line is normal to the reference contour, the variation information is preserved. Hence, the decomposed SEPE band information from such measurements will the same as variation in the distances measured with respect to the reference points.

Procedure P903 involves defining a plurality of cut lines 903, where each cut line passes through a given reference point of the plurality of reference points 901 in a normal direction to the contour of the pattern. For example, see cut lines C1-C4 in FIG. 7A, each passing through a reference point and normal to the reference contour 701. Thus, the measurement associated with each of the plurality of images is performed along the same cut line. The measurements are performed according to procedures P905 and P907.

Procedure P905 involves determining a point of intersection 905 of a given cut line with the pattern printed on the substrate. Procedure P907 involves measuring a distance 907 (e.g., dist2EPbase) between the point of intersection 905 and the given reference point.

In an embodiment, all the measurement data may be gathered to determine an EPE band associated with a contour. For example, in an embodiment, procedure P909 involves combining the distance 907 associated with each of the plurality of reference points 901 around the contour of the pattern to generate the edge placement data 909 associated with the pattern. In an embodiment, the edge placement data refers to data comprising information associated with edge placement error of a desired pattern. For example, the information include a reference contour, a location of a reference point, and edge placement error value associated with a desired printed pattern.

The method 900 (or the method 300) can further comprise determining a model to predict SEPE. For example, the method 900 further involves determining an intensity log slope of an aerial image of the pattern; and determining, based on the edge placement data 909 and the intensity log slope (ILS), a model configured to predict stochastic variation in an edge placement at any point on a contour of the pattern. As mentioned earlier, an SEPE model is not limited to a particular patterning process parameter. In an example, the SEPE model configured to predict the SEPE band may be based on other patterning related parameters such as the intensity log slope, CD change per dose change (also called dCD/dDose or dose sensitivity). For example, $\sigma_{SEPE}$ is represented as a linear (or non-linear) function of $d(CD)/d(Dose)$ and the associated parameters may be determined based on the $\sigma_{SEPE}$ data obtained from the decomposition algorithm discussed above.

An example of the SEPE model based on ILS is as follows. The SEPE model may be determined by fitting the $Q_{SEPE}$ data determined in the method 300 and the ILS data (also referred as blurred intensity log slope of an aerial image) obtained via simulation of an optical model (e.g., as discussed in FIG. 2). Then, using a model fitting method such as least square error, values of model parameters (e.g., a, b, and DC) in the following models ML1 and/or ML2 may be determined.

$$\sigma_{SEPE}=a*ILS^b \qquad \text{ML1}$$

$$\sigma_{SEPE}=a*ILS^b+DC \qquad \text{ML2}$$

It can be understood by a person skilled in the art that the model ML1 and ML2 are only examples and other appropriate model and model fitting techniques may be used to determine an SEPE model. In an embodiment, the SEPE model can be used in patterning process simulation (e.g., FIG. 2, OPC process, etc.) to determine values of parameters of the interest such as shape and size of a mask pattern, dose of a lithographic apparatus, focus of a lithographic apparatus, etc. Thus, an accurate SEPE model can be used to improve the yield of the patterning process.

In an embodiment, the method 900 (or the method 300) further involves training, using the edge placement data 909, a machine learning model configured to predict an aspect of the pattering process. In an embodiment, such machine learning based model may be developed since a large amount of data is available to define a SEPE band of any arbitrary shaped contour. On the other hand, the existing approach based on CD measurements has relatively limited coverage of a contour of the pattern, thus training models based on such limited data may not generate accurate models. When such inaccurate models are further used to in the patterning process simulation, inaccurate process conditions may be determined thereby negatively affecting the printing behavior.

In an embodiment, an aspect of the pattering process that can be improved using the SEPE band and/or SEPE model includes, but not limited to: (i) a mask pattern associated with the pattern to be printed on the substrate; (ii) a source of a lithographic apparatus used in the patterning process; (iii) resist development on the substrate; (iv) and/or manufacturability check of the pattern printed on the substrate subjected to the patterning process.

Figure 10:
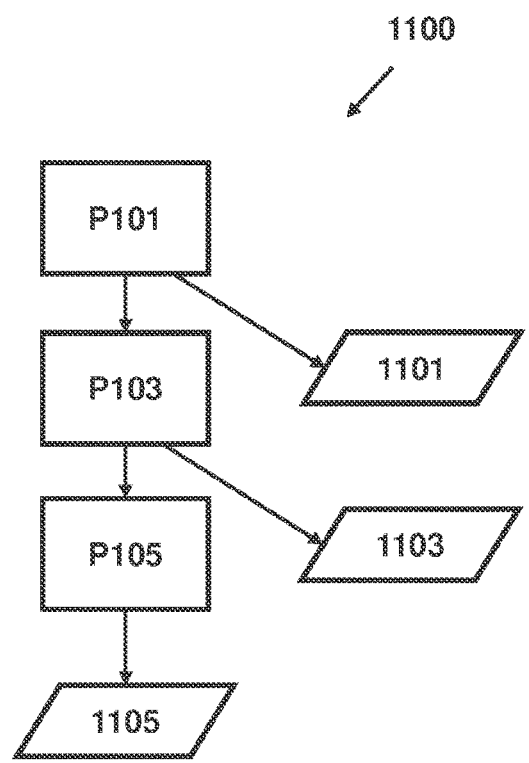
FIG. 10 is flow chart of a method for determining shrinkage in resist of a substrate caused due to measurement via a metrology tool, according to an embodiment.

Referring to FIG. 10, there is provided a method 1100 for determining shrinkage in resist of a substrate caused due to measurement via a metrology tool. Procedure P101 involves acquiring, via the metrology tool, a plurality of images of the pattern at a defined location on the substrate without performing a substrate alignment therebetween. The procedure P101 is similar to the procedure P301 discussed with respect to method 300.

Further, procedure P103 involves generating at least two data: (i) first data 1103 associated with the pattern using a first set of images of the plurality of images 1101, and (ii) second data 1104 associated with the pattern using a second set of images of the plurality of images 1101, wherein the first set of images comprises at least two consecutive images of the plurality of images 1101, and the second set of images comprises at least two different consecutive images of the plurality of images 1101. It can be understood that the first data 1103 and the second data 1104 are examples and does not limited the scope of the present disclosure. In an embodiment, more than two data may be generated by dividing the plurality of images 1101 into sub-sets in a similar manner.

Procedure P105 involves determining the shrinkage 1105 in the resist of the substrate based on a difference between the first data 1103 and the second data 1104. In an embodiment, the first data 1103 and the second data 1104 comprises values of edge placement error associated with the pattern.

In an embodiment, the method further involves determining, using the first data 1103 and the second data 1104, a metrology variation in the plurality of images 1101 caused due to the metrology tool. For example, the metrology variation $\sigma_{SEM}^2$ can be by providing the first data 1103 and the second data 1104 to the decomposition algorithm and executing equations such as equation eq. 10 discussed above.

In an embodiment, the method further involves determining a shrinkage estimation model based on the first data 1103, the second data 1104, and the metrology variation.

In an embodiment, the shrinkage model may be any mathematical model that can be fitted using the metrology variation, and a difference between the first data 1103 and the second data 1104. In an embodiment, EPE values at a defined location from run to run (e.g., $1^{st}$ image to $2^{nd}$ image) shall follow same trend, but have some shift. This shift is mainly caused by SEM beam damage and may be removed from the EPE values during the decomposition. For example, mean value of EPE may be subtracted from each SEM image.

In an embodiment, the SEPE model (e.g., a machine learning model or other appropriate mathematical model discussed above) developed based on EP gauge as discussed above can be used to improve printing of the desired pattern (e.g., patterns associated with a memory). For example, the SEPE model may be used to predict a variation band (e.g., SEPE band) associated with any arbitrary pattern including the desired pattern. The predicted SEPE band may be provided as an input to a computational lithography simulation to improve an aspect of lithography process. For example, the aspect may be a mask pattern, process conditions to be used during lithographic patterning process, etc.

In an embodiment, the SEPE band may be provided as an input associated with a design variable such as CD, EPE or cost functions used in an optimization process such as OPC simulation to determine mask pattern used in printing the desired pattern on the substrate. Example OPC process and design variables are discussed in detail with respect to FIGS. 13-16 herein.

In an embodiment, the SEPE band may be used to determine optimum process conditions (e.g., process window, dose-focus values, etc.) that causes minimum defects in the printed pattern. The process conditions may be determined via patterning process simulation (e.g., as discussed in FIG. 2) which predicts a printed pattern using to a design pattern and the SEPE band associated therewith. Such process simulation is an iterative process, where one or more process conditions (e.g., dose, focus, optics parameters, or other setting available in a lithographic apparatus) may be adjusted to improve a performance of the patterning process. For example, the performance may be measured by a performance metric such as EPE, defects, etc. Thus, based on the SEPE band the EPE may be reduced, defects in printed pattern may be reduced, or other desired improvements may be achieved.

According to present disclosure, the combination and sub-combinations of disclosed elements constitute separate embodiments. For example, a first combination includes acquiring a plurality of images, generating the first data and the second data, and determining SEPE band. The sub-combination may include the first data being computed using even numbered images of the plurality of images and the second data computed using odd numbered images. In another example, the combination includes acquiring the plurality images and determining mask variation. The mask variation is used to determine mask pattern. In another example, the combination includes acquiring the plurality of images, determining the first data and the second data to determine shrinkage in the resist of the substrate.

In some embodiments, the inspection apparatus may be a scanning electron microscope (SEM) that yields an image of a structure (e.g., some or all the structure of a device) exposed or transferred on the substrate. FIG. 11 depicts an embodiment of a SEM tool. A primary electron beam EBP emitted from an electron source ESO is converged by condenser lens CL and then passes through a beam deflector EBD1, an E×B deflector EBD2, and an objective lens OL to irradiate a substrate PSub on a substrate table ST at a focus.

When the substrate PSub is irradiated with electron beam EBP, secondary electrons are generated from the substrate PSub. The secondary electrons are deflected by the E×B deflector EBD2 and detected by a secondary electron detector SED. A two-dimensional electron beam image can be obtained by detecting the electrons generated from the sample in synchronization with, e.g., two dimensional scanning of the electron beam by beam deflector EBD1 or with repetitive scanning of electron beam EBP by beam deflector EBD1 in an X or Y direction, together with continuous movement of the substrate PSub by the substrate table ST in the other of the X or Y direction.

A signal detected by secondary electron detector SED is converted to a digital signal by an analog/digital (A/D) converter ADC, and the digital signal is sent to an image processing system IPU. In an embodiment, the image processing system IPU may have memory MEM to store all or part of digital images for processing by a processing unit PU. The processing unit PU (e.g., specially designed hardware or a combination of hardware and software) is configured to convert or process the digital images into datasets representative of the digital images. Further, image processing system IPU may have a storage medium STOR configured to store the digital images and corresponding datasets in a reference database. A display device DIS may be connected with the image processing system IPU, so that an operator can conduct necessary operation of the equipment with the help of a graphical user interface.

FIG. 12 schematically illustrates a further embodiment of an inspection apparatus. The system is used to inspect a sample 90 (such as a substrate) on a sample stage 89 and comprises a charged particle beam generator 81, a condenser lens module 82, a probe forming objective lens module 83, a charged particle beam deflection module 84, a secondary charged particle detector module 85, and an image forming module 86.

The charged particle beam generator 81 generates a primary charged particle beam 91. The condenser lens module 82 condenses the generated primary charged particle beam 91. The probe forming objective lens module 83 focuses the condensed primary charged particle beam into a charged particle beam probe 92. The charged particle beam deflection module 84 scans the formed charged particle beam probe 92 across the surface of an area of interest on the sample 90 secured on the sample stage 89. In an embodiment, the charged particle beam generator 81, the condenser lens module 82 and the probe forming objective lens module 83, or their equivalent designs, alternatives or any combination thereof, together form a charged particle beam probe generator which generates the scanning charged particle beam probe 92.

The secondary charged particle detector module 85 detects secondary charged particles 93 emitted from the sample surface (maybe also along with other reflected or scattered charged particles from the sample surface) upon being bombarded by the charged particle beam probe 92 to generate a secondary charged particle detection signal 94. The image forming module 86 (e.g., a computing device) is coupled with the secondary charged particle detector module 85 to receive the secondary charged particle detection signal 94 from the secondary charged particle detector module 85 and accordingly forming at least one scanned image. In an embodiment, the secondary charged particle detector module 85 and image forming module 86, or their equivalent designs, alternatives or any combination thereof, together form an image forming apparatus which forms a scanned image from detected secondary charged particles emitted from sample 90 being bombarded by the charged particle beam probe 92.

As noted above, SEM images may be processed to extract contours that describe the edges of objects, representing device structures, in the image. These contours are then quantified via metrics, such as CD. Thus, typically, the images of device structures are compared and quantified via simplistic metrics, such as an edge-to-edge distance (CD) or simple pixel differences between images. Typical contour models that detect the edges of the objects in an image in order to measure CD use image gradients. Indeed, those models rely on strong image gradients. But, in practice, the image typically is noisy and has discontinuous boundaries. Techniques, such as smoothing, adaptive thresholding, edge-detection, erosion, and dilation, may be used to process the results of the image gradient contour models to address noisy and discontinuous images, but will ultimately result in a low-resolution quantification of a high-resolution image. Thus, in most instances, mathematical manipulation of images of device structures to reduce noise and automate edge detection results in loss of resolution of the image, thereby resulting in loss of information. Consequently, the result is a low-resolution quantification that amounts to a simplistic representation of a complicated, high-resolution structure.

So, it is desirable to have a mathematical representation of the structures (e.g., circuit features, alignment mark or metrology target portions (e.g., grating features), etc.) produced or expected to be produced using a patterning process, whether, e.g., the structures are in a latent resist image, in a developed resist image or transferred to a layer on the substrate, e.g., by etching, that can preserve the resolution and yet describe the general shape of the structures. In the context of lithography or other patterning processes, the structure may be a device or a portion thereof that is being manufactured and the images may be SEM images of the structure. In some instances, the structure may be a feature of semiconductor device, e.g., integrated circuit. In some instances, the structure may be an alignment mark, or a portion thereof (e.g., a grating of the alignment mark), that is used in an alignment measurement process to determine alignment of an object (e.g., a substrate) with another object (e.g., a patterning device) or a metrology target, or a portion thereof (e.g., a grating of the metrology target), that is used to measure a parameter (e.g., overlay, focus, dose, etc.) of the patterning process. In an embodiment, the metrology target is a diffractive grating used to measure, e.g., overlay.

In an embodiment, the measurement data (e.g., stochastic variations) related to the printed pattern, determined according to the method of FIG. 3, may be employed in optimization of patterning process or adjusting parameters of the patterning process. As an example, OPC addresses the fact that the final size and placement of an image of the design layout projected on the substrate will not be identical to, or simply depend only on the size and placement of the design layout on the pattering device. It is noted that the terms "mask", "reticle", "patterning device" are utilized interchangeably herein. Also, person skilled in the art will recognize that, especially in the context of lithography simulation/optimization, the term "mask"/"pattering device" and "design layout" can be used interchangeably, as in lithography simulation/optimization, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another and/or non-geometrical optical effects such as diffraction and interference. Similarly, proximity effects may arise from diffusion and other chemical effects during post-exposure bake (PEB), resist development, and etching that generally follow lithography.

In order to ensure that the projected image of the design layout is in accordance with requirements of a given target circuit design, proximity effects need to be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

Application of model-based OPC to a target design involves good process models and considerable computational resources, given the many millions of features typically present in a chip design. However, applying OPC is generally not an "exact science", but an empirical, iterative process that does not always compensate for all possible proximity effect. Therefore, effect of OPC, e.g., design layouts after application of OPC and any other RET, need to be verified by design inspection, i.e. intensive full-chip simulation using calibrated numerical process models, in order to minimize the possibility of design flaws being built into the pattering device pattern. This is driven by the enormous cost of making high-end patterning devices, which run in the multi-million dollar range, as well as by the impact on turn-around time by reworking or repairing actual patterning devices once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

One RET is related to adjustment of the global bias of the design layout. The global bias is the difference between the patterns in the design layout and the patterns intended to print on the substrate. For example, a circular pattern of 25 nm diameter may be printed on the substrate by a 50 nm diameter pattern in the design layout or by a 20 nm diameter pattern in the design layout but with high dose.

In addition to optimization to design layouts or pattering devices (e.g., OPC), the illumination source can also be optimized, either jointly with pattering device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, and/or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application No. PCT/US2009/065359, filed on Nov. 20, 2009, and published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. patent application Ser. No. 12/813,456, filed on Jun. 10, 2010, and published as U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns and/or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables $(z_1, z_2, \ldots, z_N)$. The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables $(z_1, z_2, \ldots, z_N)$ comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as "wavefront manipulator" that can be used to adjust shapes of a wavefront and intensity distribution and/or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq. 1). For example, if considering N PW conditions, then one can categorize the evaluation points according to their PW conditions and write the cost functions as:

$$CF(z_1, z_2, \ldots, z_N) = \sum_{p=1}^{P} w_p f_p^2(z_1, z_2, \ldots, z_N) = \sum_{u=1}^{U}\sum_{p_u=1}^{P_u} w_{p_u} f_{p_u}^2(z_1, z_2, \ldots, z)$$ (Eq. 1')

Where $f_p(z_1, z_2, \ldots, z_N)$ is the value of $f_p(z_1, z_2, \ldots, z_N)$ under the u-th PW condition $u=1, \ldots, U$. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by yield or a desired throughput of the lithographic projection apparatus. The desired yield or throughput may limit the dose and thus has implications for the stochastic effects (e.g., imposing a lower bound on the stochastic effects). Higher throughput generally leads to lower dose, shorter longer exposure time and greater stochastic effects. Higher yield generally leads to a restricted design which may be sensitive to stochastic risk. Consideration of substrate throughput, yield and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots \tilde{z}_N) = \operatorname*{argmin}_{(z_1, z_2, \ldots, z_N) \in Z} CF(z_1, z_2, \ldots, z_N) = \operatorname*{argmin}_{(z_1, z_2, \ldots, z_N) \in Z} \sum_{p=1}^{P} w_p f_p^2(z_1, z_2, \ldots, z_N)$$ (Eq. 2)

Figure 13:
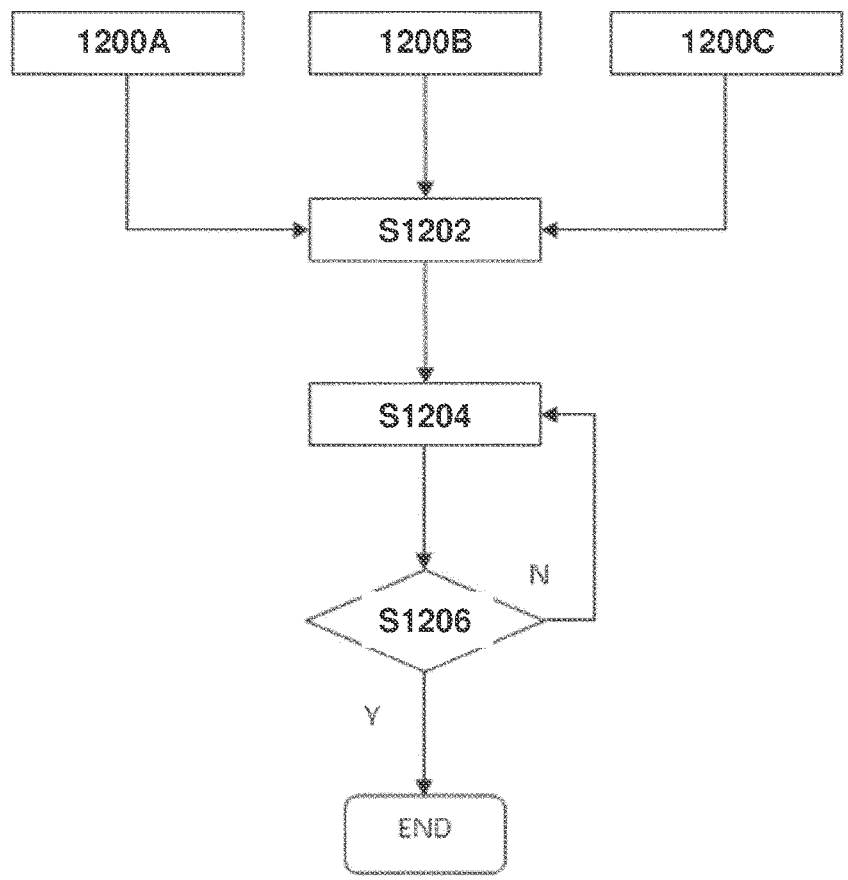
FIG. 13 is a flow diagram illustrating aspects of an example methodology of joint optimization, according to an embodiment.

A general method of optimizing the lithography projection apparatus, according to an embodiment, is illustrated in FIG. 13. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms "simultaneous", "simultaneously", "joint" and "jointly" as used herein mean that the design variables of the characteristics of the source, patterning device, projection optics and/or any other design variables, are allowed to change at the same time. The term "alternative" and "alternatively" as used herein mean that not all of the design variables are allowed to change at the same time.

Figure 14:
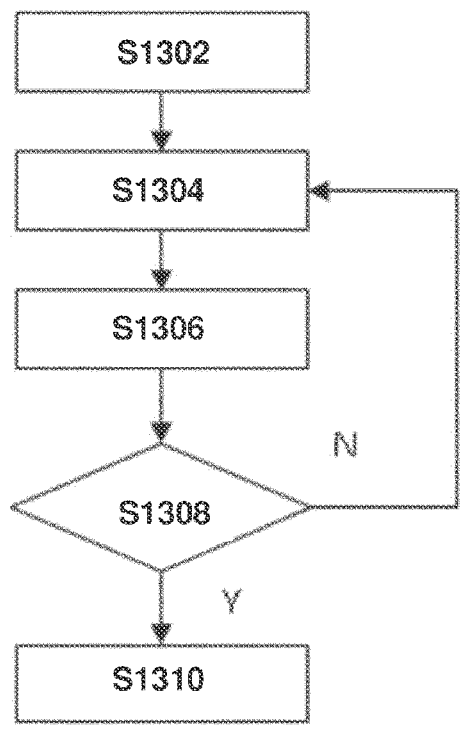
FIG. 14 shows an embodiment of another optimization method, according to an embodiment.

In FIG. 14, the optimization of all the design variables is executed simultaneously. Such flow may be called the simultaneous flow or co-optimization flow. Alternatively, the optimization of all the design variables is executed alternatively, as illustrated in FIG. 14. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 14, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally, the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the 'hot spots' and/or 'warm spots' are identified, then an MO is performed. In view of the present disclosure numerous permutations and combinations of sub-optimizations are possible in order to achieve the desired optimization results.

Figure 15A:
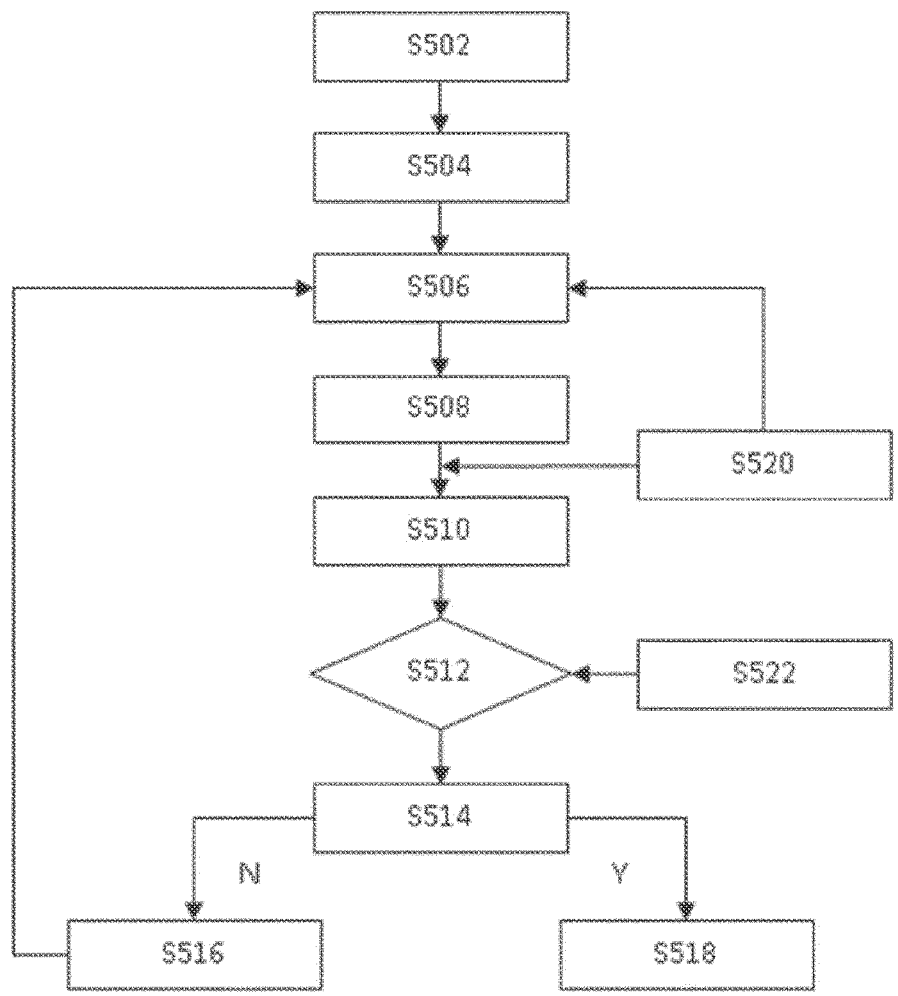
FIGS. 15A, 15B and 16 show example flowcharts of various optimization processes, according to an embodiment.

FIG. 15A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as "gauges") for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 15A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n}, (n = 1, 2, \ldots N)$$

exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $f_p(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$, $$f_p(z_1, z_2, \ldots, z_N) \approx \quad \text{(Eq. 3)}$$
$$f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}}$$

Under the approximation of Eq. 3, the cost function becomes:

$$CF(z_1, z_2, \ldots, z_N) = \quad \text{(Eq. 4)}$$
$$\sum_{p=1}^{P} w_p f_p^2(z_1, z_2, \ldots, z_N) = \sum_{p=1}^{P} w_p \bigg( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}} (z_n - z_{ni}) \bigg)^2$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $(z_{1(i+1)}, z_{2(i+1)}, \ldots, z_{N(i+1)})$ can be derived by solving by N linear equations:
wherein n=1, 2, . . . N.

$$\frac{\partial CF(z_1, z_2, \ldots, z_N)}{\partial z_n} = 0,$$

If the design variables $(z_1, z_2, \ldots, z_N)$ are under the constraints in the form of J inequalities (e.g. tuning ranges of $$(z_1, z_2, \ldots, z_N)) \sum_{n=1}^{N} A_{nj} z_n \leq B_j,$$

for j=1, 2, . . . J; and K equalities (e.g. interdependence between the design variables)

$$\sum_{n=1}^{N} C_{nk} z_n = D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni} - \Delta_D \leq z_n \leq z_{ni} + \Delta_D$. $(z_{1(i+1)}, z_{2(i+1)}, \ldots, z_{N(i+1)})$ can be derived using, for example, methods described in Numerical Optimization ($2^{nd}$ ed.) by Jorge Nocedal and Stephen J. Wight (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \leq p \leq P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \bigg( \frac{f_p(z_1, z_2, \ldots, z_N)}{CL_p} \bigg)^q, \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc.

Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \leq f_p(z_1, z_2, \ldots, z_N) \leq E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to for p=1, . . . P, $$\sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}} z_n \leq E_{up} + \sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}} z_{ni} - f_p(z_{1i}, z_{2i}, \ldots, z_{Ni}) \quad \text{(Eq. 6')}$$

and $$-\sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}} z_n \leq E_{up} - \sum_{n=1}^{N} \frac{\partial f_p(z_1, z_2, \ldots, z_N)}{\partial z_n}\bigg|_{z_1 = z_{1i}, z_2 = z_{2i}, \ldots, z_N = z_{Ni}} z_{ni} + f_p(z_{1i}, z_{2i}, \ldots, z_{Ni}) \quad \text{(Eq. 6'')}$$

Since Eq. 3 is generally valid only in the vicinity of $(z_{1i}, z_{2i}, \ldots, z_{Ni})$, in case the desired constraints $E_{Lp} \leq f_p(z_1, z_2, \ldots, z_N) \leq E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of $(z_{1i}, z_{2i}, \ldots, z_{Ni})$. Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority.

In addition, the cost functions in Eq. 4 and Eq. 5 can be modified by introducing a Lagrange multiplier to achieve compromise between the optimization on RMS of the defect size and the optimization on the worst defect size, i.e., $$CF(z_1, z_2, \ldots, z_N) = \qquad \text{(Eq. 6''')}$$
$$(1-\lambda)\sum_{p=1}^{P} w_p f_p^2(z_1, z_2, \ldots, z_N) + \lambda \max_{1 \le p \le P} \frac{f_p(z_1, z_2, \ldots, z_N)}{CL_p}$$

where $\lambda$ is a preset constant that specifies the trade-off between the optimization on RMS of the defect size and the optimization on the worst defect size. In particular, if $\lambda=0$, then this becomes Eq. 4 and the RMS of the defect size is only minimized; while if $\lambda=1$, then this becomes Eq. 5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6'' can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity ($f_0 \pm \Delta f$, $\varepsilon_0 \pm \Delta \varepsilon$):

$$CF(z_1, z_2, \ldots, z_N, f_0, E_0) = \qquad \text{(Eq. 7)}$$
$$\max_{(f,\varepsilon)=(f_0 \pm \Delta f, \varepsilon_0 \pm \Delta \varepsilon)} \max_p |f_p(z_1, z_2, \ldots, z_N, f, \varepsilon)|.$$

or $$CF(z_1, z_2, \ldots, z_N, f_0, \varepsilon_0) = \qquad \text{(Eq. 7')}$$
$$\sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon)$$

or $$CF(z_1, z_2, \ldots, z_N, f_0, \varepsilon_0) = \qquad \text{(Eq. 7'')}$$
$$(1-\lambda) \sum_{(f,\varepsilon)=(f_0 \pm \Delta f, \varepsilon_0 \pm \Delta \varepsilon)} \sum_p w_p f_p^2(z_1, z_2, \ldots, z_N, f, \varepsilon) +$$
$$\lambda \max_{(f,\varepsilon)=(f_0 \pm \Delta f, \varepsilon_0 \pm \Delta \varepsilon)} \max_p |f_p(z_1, z_2, \ldots, z_N, f, \varepsilon)|$$

If the nominal focus $f_0$ and nominal dose $\varepsilon_0$ are allowed to shift, they can be optimized jointly with the design variables ($z_1, z_2, \ldots, z_N$). In the next step, ($f_0 \pm \Delta f$, $\varepsilon_0 \pm \Delta \varepsilon$) is accepted as part of the process window, if a set of values of ($z_1, z_2, \ldots, z_N, f, \varepsilon$) can be found such that the cost function is within a preset limit.

Alternatively, if the focus and dose are not allowed to shift, the design variables ($z_1, z_2, \ldots, z_N$) are optimized with the focus and dose fixed at the nominal focus $f_0$ and nominal dose $\varepsilon_0$. In an alternative embodiment, ($f_0 \pm \Delta f$, $\varepsilon_0 \pm \Delta \varepsilon$) is accepted as part of the process window, if a set of values of ($z_1, z_2, \ldots, z_N$) can be found such that the cost function is within a preset limit.

The methods described earlier in this disclosure can be used to minimize the respective cost functions of Eqs. 7, 7', or 7''. If the design variables are characteristics of the projection optics, such as the Zernike coefficients, then minimizing the cost functions of Eqs. 7, 7', or 7'' leads to process window maximization based on projection optics optimization, i.e., LO. If the design variables are characteristics of the source and patterning device in addition to those of the projection optics, then minimizing the cost function of Eqs. 7, 7', or 7'' leads to process window maximizing based on SMLO, as illustrated in FIG. 14. If the design variables are characteristics of the source and patterning device and, then minimizing the cost functions of Eqs. 7, 7', or 7'' leads to process window maximization based on SMO. The cost functions of Eqs. 7, 7', or 7'' can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 16:
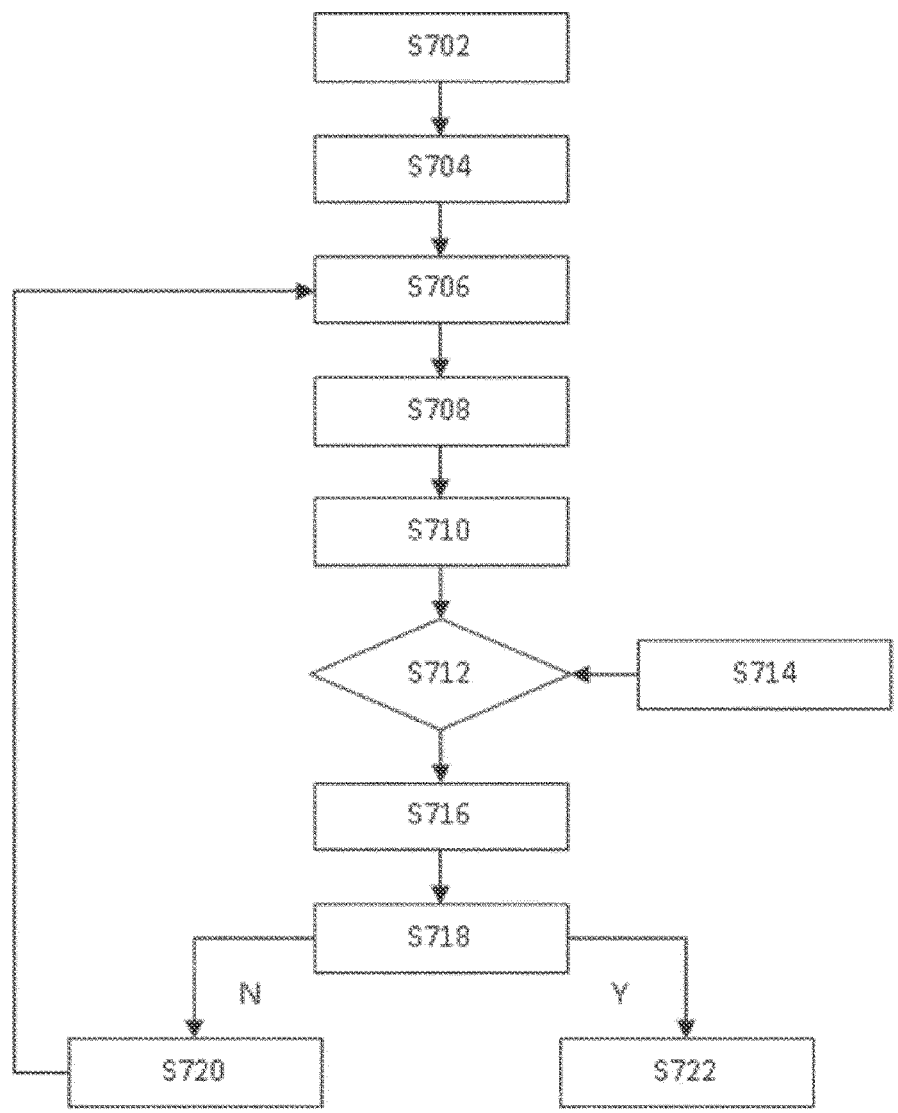

FIG. 16 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 15A. As mentioned before, the final output may be a wavefront aberration map in the pupil plane, optimized to produce the desired imaging performance. The final output may also be an optimized source map and/or an optimized design layout.

Figure 15B:
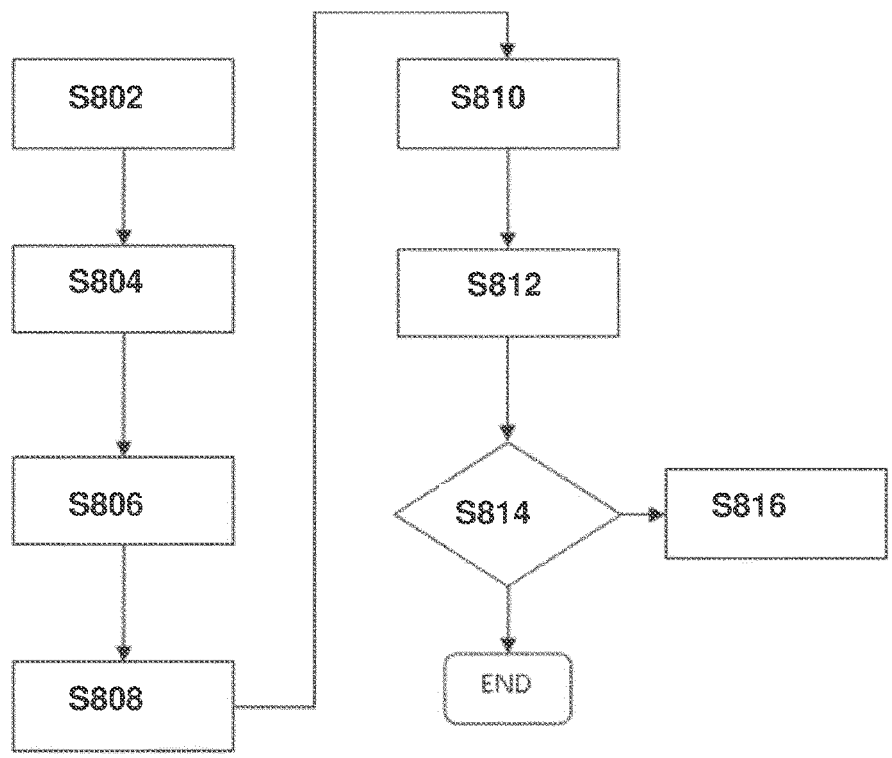

FIG. 15B shows an exemplary method to optimize the cost function where the design variables ($z_1, z_2, \ldots, z_N$) include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the pattering device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the pattering device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups and/or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features. In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 17:
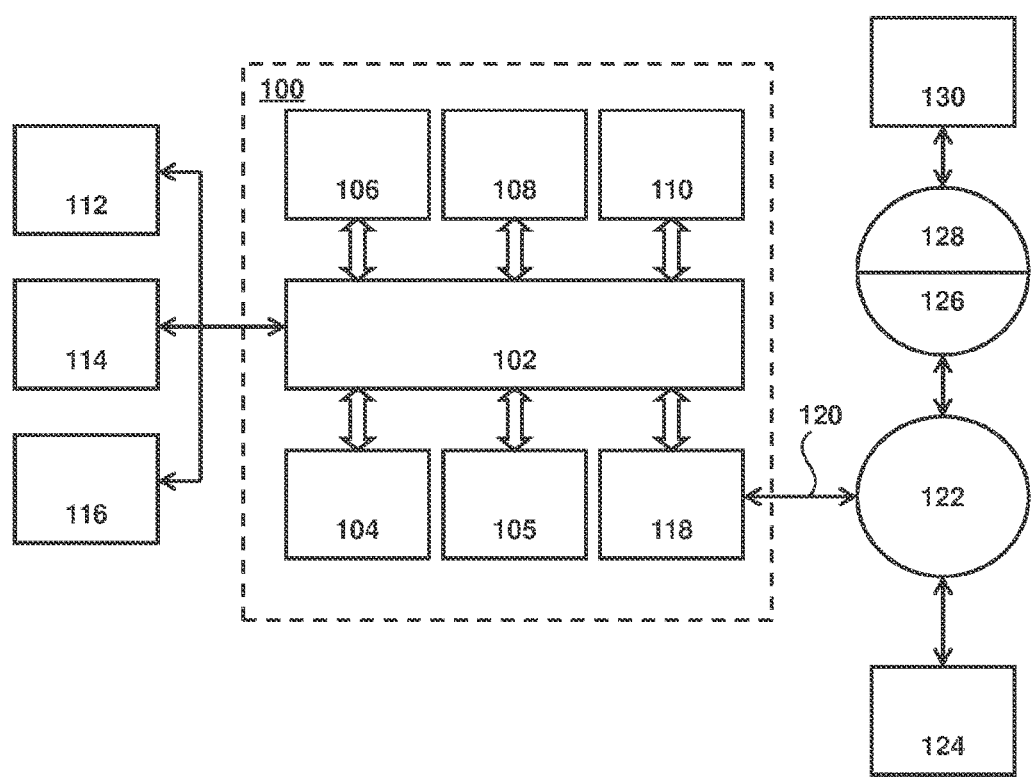
FIG. 17 is a block diagram of an example computer system, according to an embodiment.

FIG. 17 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 18:
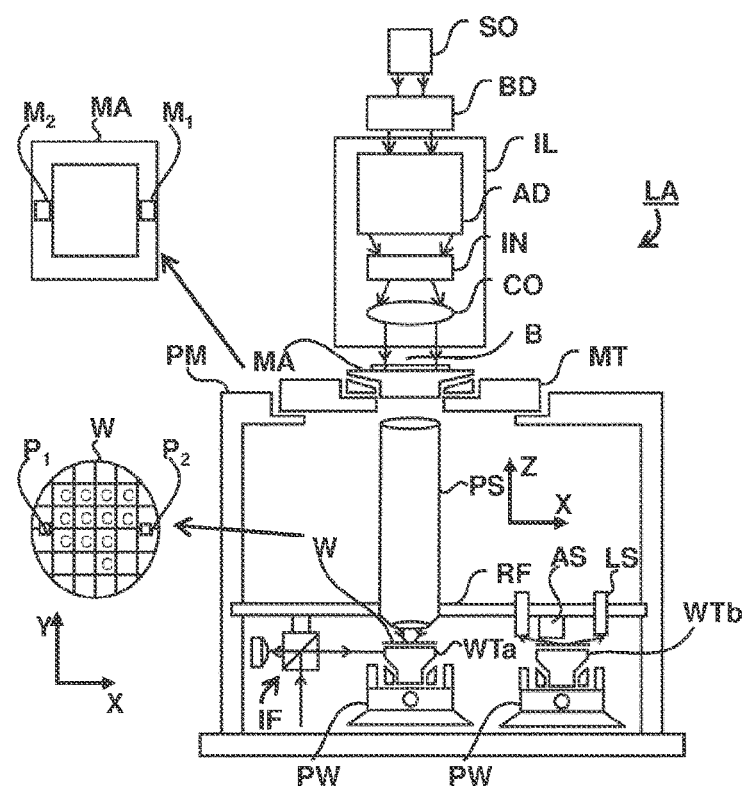
FIG. 18 is a schematic diagram of a lithographic projection apparatus, according to an embodiment.

FIG. 18 schematically depicts an exemplary lithographic projection apparatus whose illumination source could be optimized utilizing the methods described herein. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 18 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 18. However, in the case of a wafer stepper (as opposed to a step-and-scan tool) the patterning device table MT may just be connected to a short stroke actuator, or may be fixed.

The depicted tool can be used in two different modes:
In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 19:
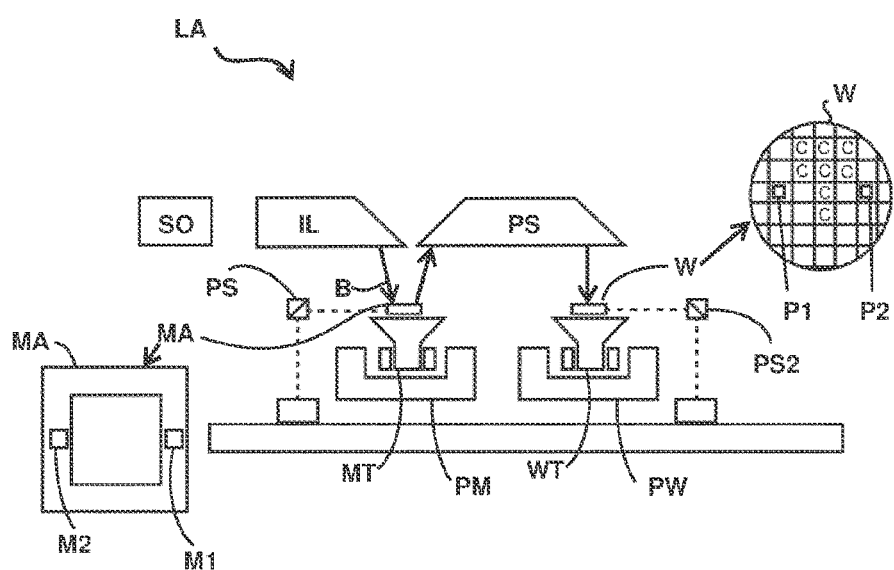
FIG. 19 is a schematic diagram of another lithographic projection apparatus, according to an embodiment.

FIG. 19 schematically depicts another exemplary lithographic projection apparatus LA whose illumination source could be optimized utilizing the methods described herein.

The lithographic projection apparatus LA includes:
a source collector module SO
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the mask may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 19, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 19, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 20:
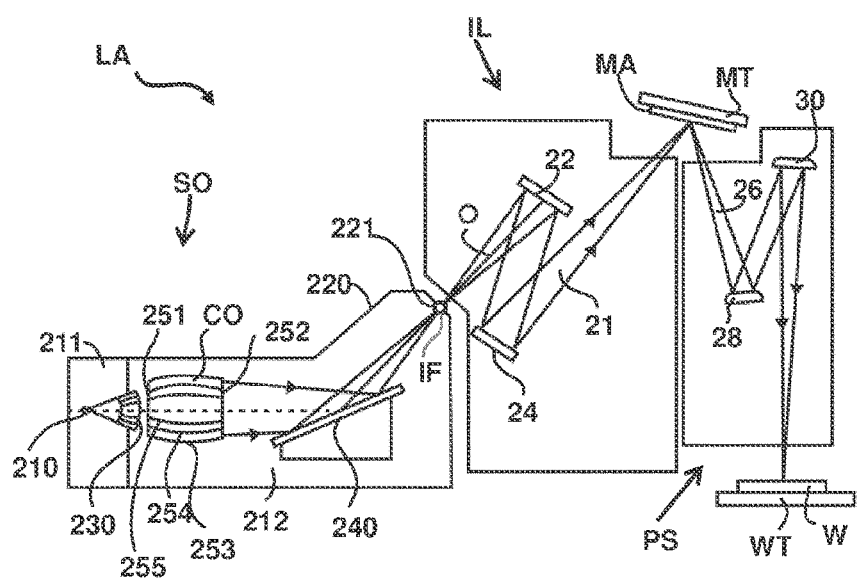
FIG. 20 is a more detailed view of the apparatus in FIG. 19, according to an embodiment.

FIG. 20 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 20.

Collector optic CO, as illustrated in FIG. 20, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is preferably used in combination with a discharge produced plasma source, often called a DPP source.

Figure 21:
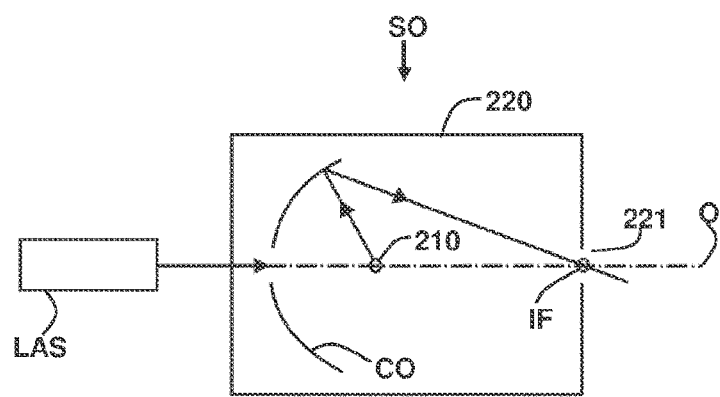
FIG. 21 is a more detailed view of the source collector module SO of the apparatus of FIGS. 19 and 20, according to an embodiment.

Alternatively, the source collector module SO may be part of an LPP radiation system as shown in FIG. 21. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

Embodiments of the present disclosure can be further described in the following clauses.

1. A method for determining stochastic edge placement error associated with a pattern, the method comprising:
    acquiring, via a metrology tool, a plurality of images of the pattern at a defined location on the substrate without performing a substrate alignment therebetween;
    generating at least two data: (i) first data associated with the pattern using a first set of images of the plurality of images, and (ii) second data associated with the pattern using a second set of images of the plurality of images, wherein the first set of images and the second set of images include at least one different image; and
    determining, using the first data and the second data associated with the pattern at the defined location, the stochastic edge placement error associated with the pattern.
2. The method of clause 1, wherein the metrology tool acquires each of the plurality of images using a single metrology recipe, wherein the metrology recipe comprises a field of view and positioning information associated with the defined location on the substrate.
3. The method of any of clauses 1-2, wherein the acquiring of the plurality of images of the defined location comprises:
    aligning the substrate with the metrology tool; and
    acquiring each of the plurality of images of the pattern at the defined location in a first die of the substrate without acquiring an image in a second die of the substrate.
4. The method of any of clauses 1-3, wherein the first set of images and the second set of images include all different images of the plurality of images associated with the defined location.
5. The method of any of clauses 1-4, wherein after acquiring the plurality of images the defined location on the substrate, then acquiring a second plurality of images at a second location on the substrate.
6. The method of any of clauses 1-5, wherein the first data and the second data has a placement error of approximately 1 pixel size, the placement error being associated with positioning of the metrology tool at the defined location on the substrate.
7. The method of any of clauses 1-6, wherein the first data and the second data has a time lag difference of less than 1 µs, the time lag difference is associated with a dwelling time of a pixel of a given image acquired by the metrology tool.
8. The method of any of clauses 1-7, wherein the first data and the second data is generated without refocusing of the metrology tool, and/or without re-alignment of the substrate during measuring by the metrology tool.
9. The method of any of clauses 1-8, wherein the generating of the first data and the second data comprises:
    selecting the first set of images of plurality of images and the second set of images of plurality of images that is different from the first set of images;
    overlapping the first set of images;
    determining values of edge placement errors using the overlapped first set of images to generate the first data;
    overlapping the second set of images; and
    determining values of edge placement errors using the overlapped second set of images to generate the second data.
10. The method of clause 9, wherein the determining a value of an edge placement error comprises:
    defining a plurality of reference points around a contour of the pattern;
    defining a plurality of cut lines, each cut line passing through a given reference point of the plurality of reference points in a normal direction to the contour of the pattern;
    determining a point of intersection of a given cut line with the pattern in a given image of the plurality of images; and
    measuring a distance between the point of intersection and the given reference point, wherein the edge placement error comprises the measured distances associated with each image of the plurality of images.
11. The method of any of clauses 1-10, wherein the determining the stochastic edge placement error involves extracting via a decomposition algorithm:
    a first variation associated with the metrology tool using the first data, the second data, and values of edge placement errors across the substrate; and
    a second variation associated with the pattern based on the first data, the second data, and the first variation.
12. The method of any of clauses 1-11, further comprising:
    determining an intensity log slope of an aerial image of the pattern or determining a dose sensitivity; and
    determining, based on the stochastic edge placement error associated with the pattern and the intensity log slope or the dose sensitivity, a model configured to predict stochastic variation in an edge placement at any point on a contour of the pattern.
13. The method of any of clauses 1-12, wherein an image of the plurality of images is a pixelated image.
14. The method of any of clauses 1-13, wherein the metrology tool is a scanning electron microscope (SEM) and the plurality of images are SEM images.
15. The method of any of clauses 1-14, further comprising:
    determining optical proximity corrections for a mask associated with the pattern to be printed on the substrate based on the stochastic edge placement error.
16. A method for determining edge placement error associated with a pattern to be printed on a substrate, the method comprising:
    defining a plurality of reference points around a contour of the pattern;
    defining a plurality of cut lines, wherein each cut line passes through a given reference point of the plurality of reference points in a normal direction to the contour of the pattern;
    determining a point of intersection of a given cut line with the pattern printed on the substrate;
    measuring a distance between the point of intersection and the given reference point; and
    combining the distance associated with each of the plurality of reference points around the contour of the pattern to generate the edge placement error associated with the pattern.
17. The method of clause 16, further comprising:
    determining an intensity log slope of an aerial image of the pattern; and
    determining, based on the edge placement error and the intensity log slope, a model configured to predict stochastic variation in an edge placement at any point on a contour of the pattern.
18. The method of any of clauses 16-17, further comprising:
    training, using the edge placement error, a machine learning model configured to predict an aspect of the patterning process.

19. The method of clause 18, wherein an aspect of the patterning process comprises:
 a mask pattern associated with the pattern to be printed on the substrate;
 a source of a lithographic apparatus used in the patterning process;
 resist development on the substrate; and/or
 manufacturability check of the pattern printed on the substrate subjected to the patterning process.

20. A method for determining shrinkage in resist of a substrate caused due to measurement via a metrology tool, the method comprising:
 acquiring, via the metrology tool, a plurality of images of a pattern at a defined location on the substrate without performing a substrate alignment therebetween;
 generating at least two data: (i) first data associated with the pattern using a first set of images of the plurality of images, and (ii) second data associated with the pattern using a second set of images of the plurality of images, wherein the first set of images comprises at least two consecutive images of the plurality of images, and the second set of images comprises at least two different consecutive images of the plurality of images; and
 determining the shrinkage in the resist of the substrate based on a difference between the first data and the second data.

21. The method of clause 20, wherein the first data and the second data comprises values of edge placement error associated with the pattern.

22. The method of any of clauses 20-21, further comprising:
 determining, using the first data and the second data, a metrology variation in the plurality of images caused due to the metrology tool.

23. The method of clause 22, further comprising:
 determining a shrinkage estimation model based on the first data, the second data, and the metrology variation.

24. A computer program product comprising a non-transitory computer readable medium having instructions recorded thereon, the instructions when executed by a computer implementing the method of any of the above clauses.

25. A non-transitory computer-readable medium having instructions therein, the instructions, when executed by one or more processors, configured to cause the one or more processors to implement the method of any of clauses 1-23.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method for determining shrinkage in resist of a substrate caused due to measurement via a metrology tool, the method comprising:
 acquiring, from the metrology tool, a plurality of images of a pattern at a defined location on the substrate without a substrate alignment performed between captures of the images;
 generating at least two data: (i) first data associated with the pattern using a first set of images of the plurality of images, and (ii) second data associated with the pattern using a second set of images of the plurality of images, wherein the first set of images comprises at least two consecutive images of the plurality of images, and the second set of images comprises at least two different consecutive images of the plurality of images; and
 determining, by a hardware computer system and based on a difference between the first data and the second data, the shrinkage in the resist of the substrate.

2. The method of claim 1, wherein the first data and second data comprises values of edge placement error associated with the pattern.

3. The method of claim 1, further comprising determining, using the first data and second data, a metrology variation in the plurality of images caused due to the metrology tool.

4. The method of claim 3, wherein the determining the metrology variation comprises providing the first data and second data to a decomposition algorithm.

5. The method of claim 3, further comprising determining a shrinkage estimation model based on the first data, the second data, and the metrology variation.

6. The method of claim 5, wherein the shrinkage estimation model is a mathematical model that is fitted using the metrology variation and a difference between the first data and the second data.

7. The method of claim 1, wherein each of the plurality of images is acquired by the metrology tool using a single metrology recipe, wherein the metrology recipe comprises a field of view and positioning information associated with the defined location on the substrate.

8. The method of claim 1, wherein the first data and second data has a placement error of approximately 1 pixel size, the placement error being associated with positioning of a measurement point or field of the metrology tool at the defined location on the substrate.

9. The method of claim 1, wherein the first data and second data has a time lag difference of less than 1 us, the time lag difference is associated with a dwelling time of a pixel of a given image acquired by the metrology tool.

10. The method of claim 1, wherein an image of the plurality of images is a pixelated image.

11. The method of claim 1, wherein the metrology tool is a scanning electron microscope (SEM) and the plurality of images are SEM images.

12. The method of claim 1, wherein the generating of the first data and the second data comprises:
 overlapping the first set of images;
 determining values of edge placement error using the overlapped first set of images to generate the first data;
 overlapping the second set of images; and
 determining values of edge placement error using the overlapped second set of images to generate the second data.

13. The method of claim 12, wherein the determining values of edge placement error comprises:
 defining a plurality of reference points around a contour of the pattern;
 defining a plurality of cut lines, each cut line passing through a given reference point of the plurality of reference points in a normal direction to the contour of the pattern;
 determining a point of intersection of a given cut line with the pattern in a given image of the plurality of images; and
 measuring a distance between the point of intersection and the given reference point, wherein the edge placement error comprises the measured distances associated with each image of the plurality of images.

14. The method of claim 1, further comprising determining, based on the shrinkage in the resist, an adjustment for a measurement result produced by the metrology tool.

15. A computer program product comprising a non-transitory computer readable medium having instructions therein, the instructions, when executed by a processor system, configured to cause the computer system to at least:
   acquire, from a metrology tool, a plurality of images of a pattern at a defined location on a substrate without a substrate alignment performed between captures of the images;
   generate at least two data: (i) first data associated with the pattern using a first set of images of the plurality of images, and (ii) second data associated with the pattern using a second set of images of the plurality of images, wherein the first set of images comprises at least two consecutive images of the plurality of images, and the second set of images comprises at least two different consecutive images of the plurality of images; and
   determine, based on a difference between the first data and the second data, shrinkage in a resist of the substrate caused due to measurement via the metrology tool.

16. The medium of claim 15, wherein the first data and second data comprises values of edge placement error associated with the pattern.

17. The medium of claim 15, wherein the instructions are further configured to cause the processor system to determine, using the first data and second data, a metrology variation in the plurality of images caused due to the metrology tool.

18. The medium of claim 15, wherein the instructions are further configured to cause the processor system to:
   overlap the first set of images;
   determine values of edge placement error using the overlapped first set of images to generate the first data;
   overlap the second set of images; and
   determine values of edge placement error using the overlapped second set of images to generate the second data.

19. The medium of claim 15, wherein the metrology tool is a scanning electron microscope (SEM) and the plurality of images are SEM images.

20. The medium of claim 15, wherein the instructions are further configured to cause the processor system to determine, based on the shrinkage in the resist, an adjustment for a measurement result produced by the metrology tool.

* * * * *